United States Patent [19]
Oomura et al.

[11] Patent Number: 5,694,010
[45] Date of Patent: Dec. 2, 1997

[54] METHOD AND APPARATUS FOR CONTROLLING A BRUSHLESS DC MOTOR

[75] Inventors: Naoki Oomura; Atsuyuki Hiruma; Shingo Ikawa, all of Shizuoka-ken, Japan

[73] Assignee: Kabushiki Kaisha Toshiba, Kawasaki, Japan

[21] Appl. No.: 479,467

[22] Filed: Jun. 7, 1995

[30] Foreign Application Priority Data

Jun. 14, 1994 [JP] Japan ................................ 6-155147

[51] Int. Cl.⁶ .................................................. H02P 6/12
[52] U.S. Cl. .................................... 318/254; 318/439
[58] Field of Search ............................ 318/138, 254, 318/439

[56] References Cited

U.S. PATENT DOCUMENTS

| | | | |
|---|---|---|---|
| 4,712,050 | 12/1987 | Nagasawa et al. | 318/254 |
| 4,900,993 | 2/1990 | Yasohara et al. | 318/254 |
| 5,399,953 | 3/1995 | Yoshino | 318/799 |
| 5,446,354 | 8/1995 | Hiruma | 318/439 |

FOREIGN PATENT DOCUMENTS 64-8890  1/1989  Japan .

*Primary Examiner*—Bentsu Ro
*Attorney, Agent, or Firm*—Cushman, Darby & Cushman IP Group of Pillsbury Madison & Sutro LLP

[57] ABSTRACT

A method and apparatus for controlling a brushless DC motor which has a permanent magnet rotor and a 3-phase stator winding for applying a rotating magnetic field to the permanent magnet rotor. A specified reference voltage is compared with the stator winding terminal voltages for each phase. The rotor position is detected from the output of these comparison circuits based on the induced voltages generated in the stator windings which are not conducting when the motor is rotated. The stator windings which conduct current are controlled in response. Furthermore, a specific conduction pattern is supplied to each stator winding when the rotor is stopped, and a reference output determined for the conduction pattern is compared with the output of the comparison circuits when the stator windings are conducting. Abnormalities are detected based on the comparison results of the comparison circuit.

14 Claims, 14 Drawing Sheets

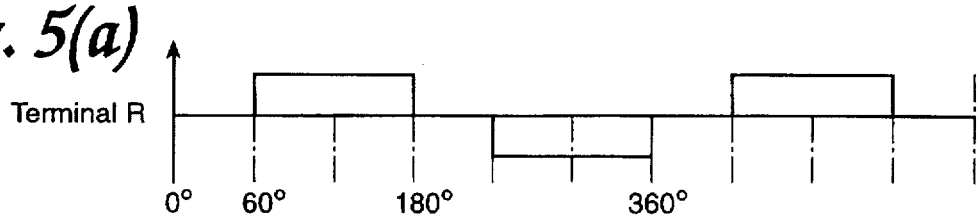
*Fig. 5(a)* Terminal R
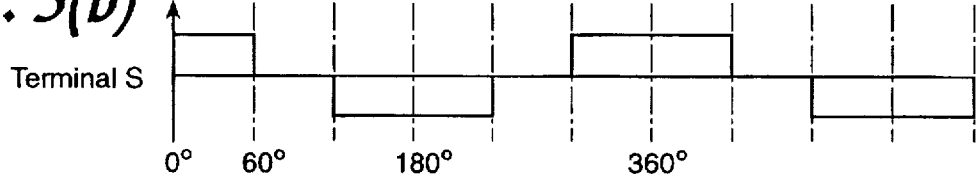
*Fig. 5(b)* Terminal S
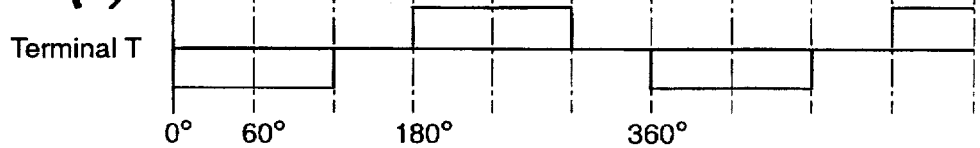
*Fig. 5(c)* Terminal T
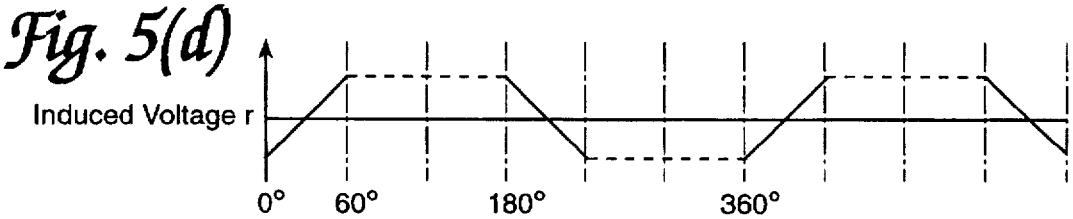
*Fig. 5(d)* Induced Voltage r
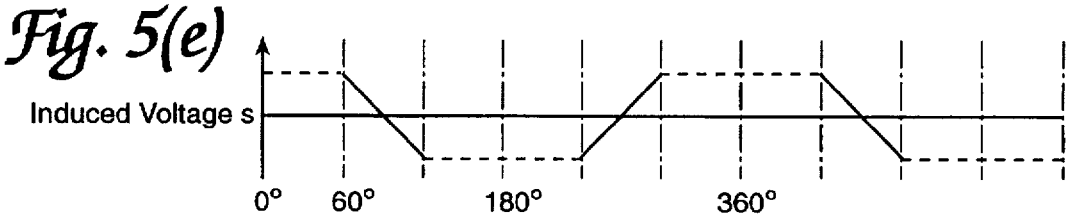
*Fig. 5(e)* Induced Voltage s
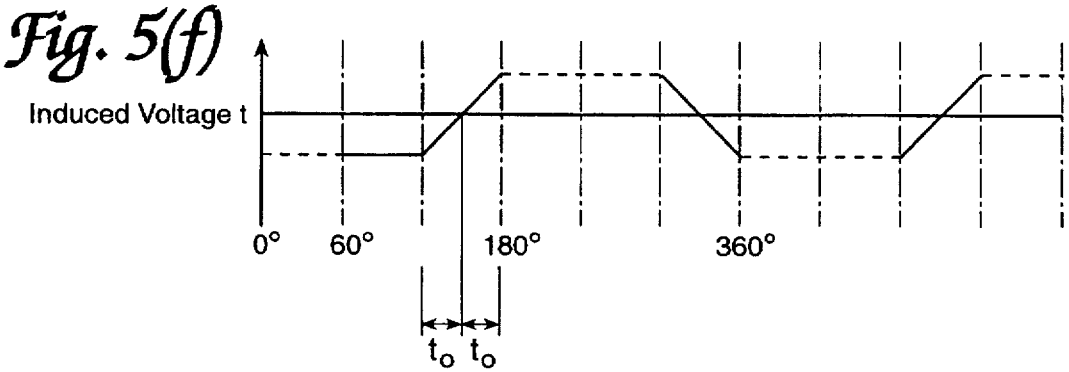
*Fig. 5(f)* Induced Voltage t

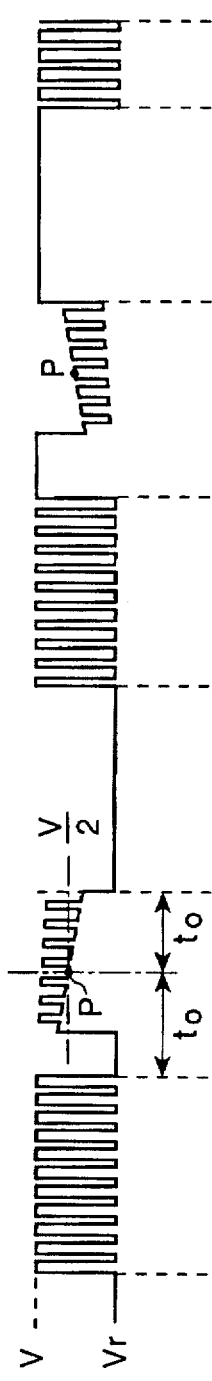
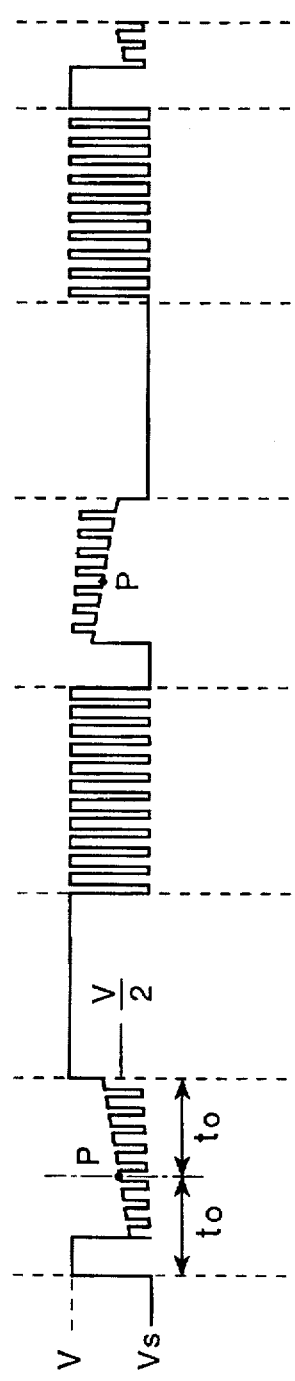
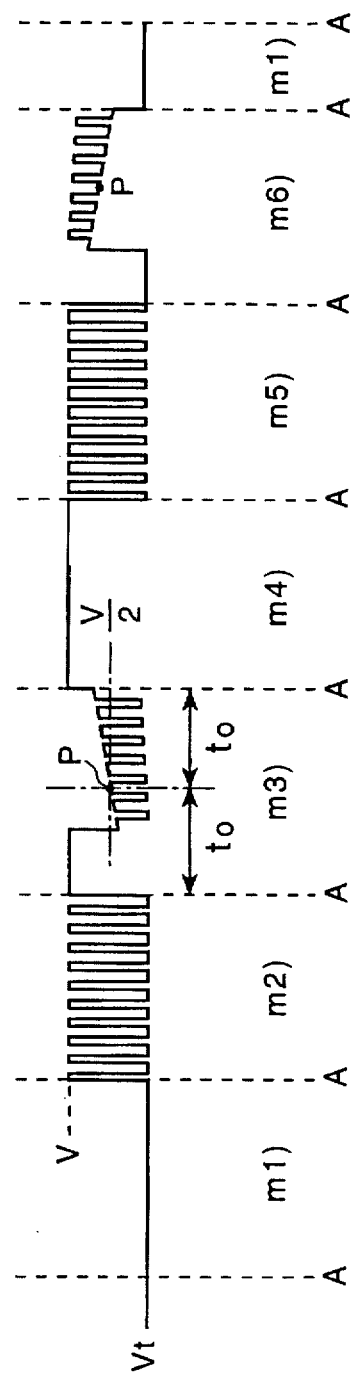
Fig. 6(a)
Fig. 6(b)
Fig. 6(c)

Fig. 7

| Pattern | Switching State Tr1 to Tr6 | | | | | | Normal Output of Comparators | | | |
|---|---|---|---|---|---|---|---|---|---|---|
| | Tr1 | Tr2 | Tr3 | Tr4 | Tr5 | Tr6 | 46 | 47 | 48 | 50 |
| a) | ON | ON | ON | OFF | OFF | OFF | H | H | H | — |
| b) | OFF | OFF | OFF | ON | ON | ON | L | L | L | — |
| c) | ON | OFF | ON | OFF | ON | OFF | H | L | H | H |
| d) | ON | OFF | OFF | OFF | ON | ON | H | L | L | L |
| e) | ON | ON | OFF | OFF | OFF | ON | H | H | L | H |
| f) | OFF | ON | OFF | ON | OFF | ON | L | H | L | L |

Fig. 8

| Pattern | Switching State Tr1 to Tr6 | | | | | | Normal Output of Comparators | | | |
|---|---|---|---|---|---|---|---|---|---|---|
| | Tr1 | Tr2 | Tr3 | Tr4 | Tr5 | Tr6 | 46 | 47 | 48 | 50 |
| m1) | PWM | OFF | OFF | OFF | OFF | ON | *H | L→H | L | L→H |
| m2) | OFF | ON | OFF | OFF | OFF | PWM | H→L | H | *L | H→L |
| m3) | OFF | PWM | OFF | ON | OFF | OFF | L | *H | L→H | L→H |
| m4) | OFF | OFF | ON | PWM | OFF | OFF | *L | H→L | H | H→L |
| m5) | OFF | OFF | PWM | OFF | ON | OFF | L→H | L | *H | H→L |
| m6) | ON | OFF | OFF | OFF | PWM | OFF | H | *L | H→L | H→L |

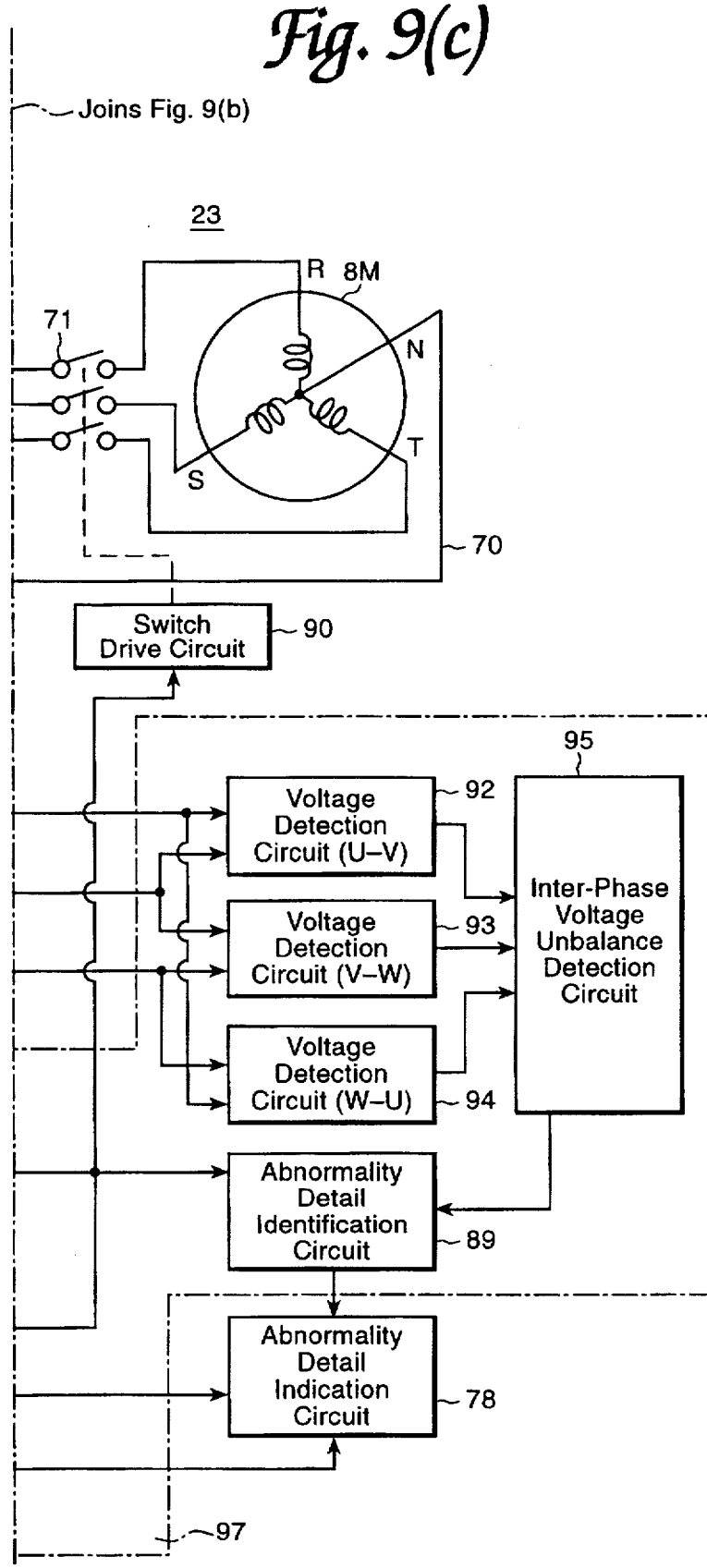

Fig. 10

| Pattern | Switching State Tr11 to Tr16 | | | | | | Normal Output of Comparators | | |
|---|---|---|---|---|---|---|---|---|---|
| | Tr11 | Tr12 | Tr13 | Tr14 | Tr15 | Tr16 | 79 | 80 | 81 |
| a) | ON | OFF | OFF | OFF | ON | ON | H | L | L |
| b) | OFF | ON | ON | ON | OFF | OFF | L | H | H |

Fig. 11

| Pattern | Switching State Tr11 to Tr16 | | | | | | Normal Output of Comparators | | |
|---|---|---|---|---|---|---|---|---|---|
| | Tr11 | Tr12 | Tr13 | Tr14 | Tr15 | Tr16 | 79 | 80 | 81 |
| c) | ON | OFF | OFF | OFF | ON | OFF | H | L | – |
| d) | OFF | OFF | ON | ON | OFF | OFF | L | – | H |
| e) | OFF | ON | OFF | OFF | OFF | ON | – | H | L |

Fig. 13

| Pattern | Switching State Tr21 to Tr26 | | | | | | Normal Output of Comparators | | |
|---|---|---|---|---|---|---|---|---|---|
| | Tr21 | Tr22 | Tr23 | Tr24 | Tr25 | Tr26 | 104 | 105 | 106 |
| m1) | PWM | OFF | OFF | OFF | OFF | ON | H/L | -(L→H) | L |
| m2) | OFF | ON | OFF | OFF | OFF | PWM | -(H→L) | H | L/H |
| m3) | OFF | PWM | OFF | ON | OFF | OFF | L | H/L | -(L→H) |
| m4) | OFF | OFF | ON | PWM | OFF | OFF | L/H | -(H→L) | H |
| m5) | OFF | OFF | PWM | OFF | ON | OFF | -(L→H) | L | H/L |
| m6) | ON | OFF | OFF | OFF | PWM | OFF | H | L/H | -(H→L) |

METHOD AND APPARATUS FOR CONTROLLING A BRUSHLESS DC MOTOR

BACKGROUND OF THE INVENTION

1. Field of the Invention

The present invention relates to a control apparatus and method for a brushless DC motor.

2. Description of Related Art

In a conventional DC motor, commutations, essentially a mechanical switching operation, control the current through the stator windings. This operation is accomplished in conventional DC motors with brushes and segmented commutators. In such a construction, the brushes wear and require frequent replacement. Sparking and its attendant generation of RF noise cannot be avoided. However, DC motors typically have higher torque and efficiency than AC induction motors. Thus, recently, a brushless DC motor has been developed. Some brushless motors have one or more sensors, for example hall effect devices, to detect the position of a permanent magnet rotor of the DC motor without touching the rotor. Furthermore, sensorless brushless DC motors have been developed which are simpler and less expensive than brushless DC motors with sensors.

A typical sensorless brushless DC motor has three phase stator windings and a permanent magnet rotor. The stator windings are selectively energized or caused to conduct current to apply a rotating magnetic field to the permanent magnet rotor. In the energization pattern, at any particular time only two of the phases are conducting current, leaving one phase not conducting current. The stator windings are energized and deenergized during the rotation of the brushless DC motor, based on a comparison of the induced voltage generated in the non-conducting stator winding with a specified reference voltage. In this motor, three comparator circuits are provided to compare the induced voltage of each winding and the specified reference voltage.

In this type of brushless DC motor, an activation malfunction or a short-circuit of a switching transistor of an inverter, which functions as a static commutator, is detected based on the current passing through the stator windings or the motor current. For detection of these malfunctions, the DC motor current is detected by a current detector inserted in series with the current providing circuit of the DC motor. When the detected current is above a specified value, it is determined that a switching transistor of the inverter has short-circuited or the motor failed to start rotating. Then, power is disconnected from the DC motor.

As described above, the induced voltages generated in the non-conducting windings during rotation of the brushless DC motor are compared with a reference voltage. The position of the permanent magnet rotor is detected based on that variation. Sequential current conduction phase switching is executed taking this detected rotor position point as a reference. Since the rotor is not rotating right after the motor is energized, induced voltages are not generated in the non-conducting stator windings because there are no rotating magnetic fields. Therefore, on energization, the stator windings are selectively energized without detection of the rotating position of the rotor in a process called "forced commutation". Then, when a specified time has elapsed after which it is possible to detect the induced voltages generated as a result of forced commutation, commutation based on the detected rotor position starts.

However, when the motor rotor is mechanically constrained, or a drive circuit which drives the switching transistors of the inverter does not operate normally, the motor cannot rotate. Thus, the rotor position cannot be detected even after the specified time has elapsed. At this point, commutation is suspended, and an abnormality, in the form of an activation malfunction, is signaled.

In the above brushless DC motor, the following three abnormalities are considered to have the highest probability:

(a) The motor fails to rotate due to a mechanical failure locking the position of the motor rotor.

(b) Open-phase output due to a failure in the inverter or the drive circuit.

(c) Rotor position cannot be detected due to a failure of an element in a rotor position detection circuit which includes the comparator circuits.

These failures were all expressed as activation malfunctions in the prior art. However, when repairing these failures, the motor must be replaced in response to malfunction (a); the inverter element or drive circuit must be replaced or the wiring between these circuits must be checked in response to malfunction (b); and the position detection circuit must be replaced in response to malfunction (c). Thus, after a failure, the service engineer must discriminate which of these three malfunctions is the cause.

Usually, the circuit components for a DC motor, that is, the inverter, the drive circuit and the position detection circuit, are all mounted on a single substrate. In such a DC motor, when the malfunction is caused by circuit parts, the DC motor can be repaired by replacing that substrate, so that discrimination between malfunctions (b) and (c) is not required. Therefore, it is only necessary to discriminate malfunction (a) from malfunctions (b) and (c).

However, in the prior art there was no device which could discriminate between rotation failure due to motor malfunction (a) and malfunctions (b) and (c). Thus, after an activation malfunction was detected, the service engineer replaced one of the parts of the DC motor. If the DC motor then performed normally, the replaced part was considered faulty. If the activation malfunction re-occurred despite the replacement, one of the unreplaced parts might be faulty. Therefore, the service engineer reinstalled the previously replaced part and replaced one of the unreplaced parts with a new component until the DC motor operated normally. Thus, the work of the service engineer was very inefficient.

Furthermore, if the DC motor was built into a sealed compressor to rotate a compression mechanism, pipes connected to the compressor to carry refrigerant had to be disconnected. Then the compressor itself had to be replaced. Therefore, it is desirable to accurately determine the cause of a failure.

SUMMARY OF THE INVENTION

It is an object of the invention to provide a method and apparatus for controlling a brushless DC motor which can accurately indicate the cause of a failure.

It is another object of the invention to improve the efficiency of replacing parts of a brushless DC motor after the DC motor has failed.

It is a further object of the invention to provide a method and apparatus for controlling a brushless DC motor which can indicate the cause of a failure before the DC motor is energized.

To achieve the above objects, the present invention provides an improved method and apparatus for controlling a brushless DC motor which has a permanent magnet rotor and a 3-phase stator winding for applying a rotating magnetic field to the permanent magnet rotor. A specified reference voltage is compared with induced voltages in the stator winding which is not energized, and as a result of these comparisons the position of the rotor is determined. The energization of the windings is controlled based on the rotor position. Furthermore, specific conduction patterns can be applied to the stator windings when the rotor is stopped. The voltages detected at the windings are compared with optimal voltages produced when the circuitry is operating properly. Abnormalities are detected when the comparison result is not as expected.

BRIEF DESCRIPTIONS OF THE DRAWINGS

Figure 9A:
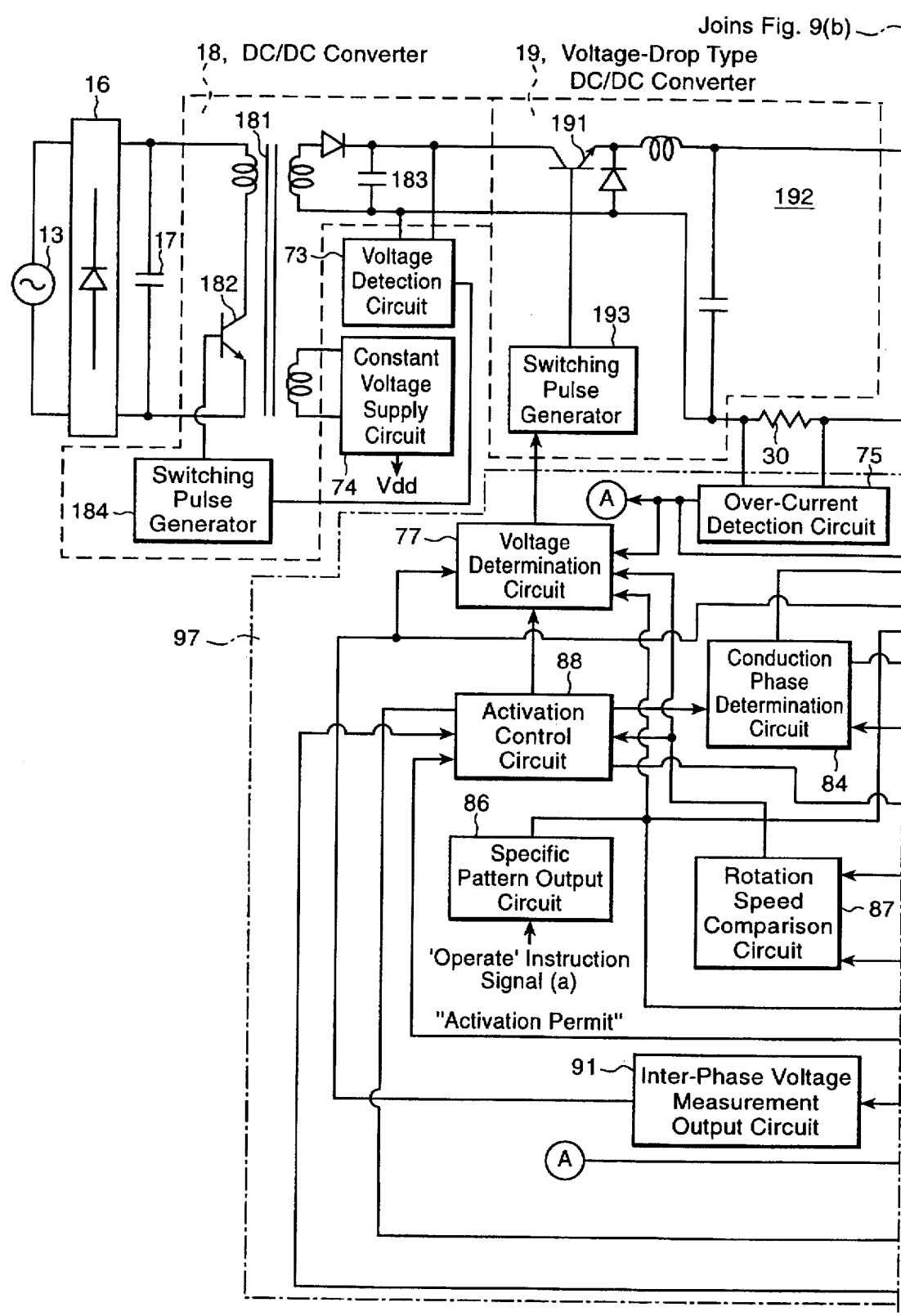
Figure 9B:
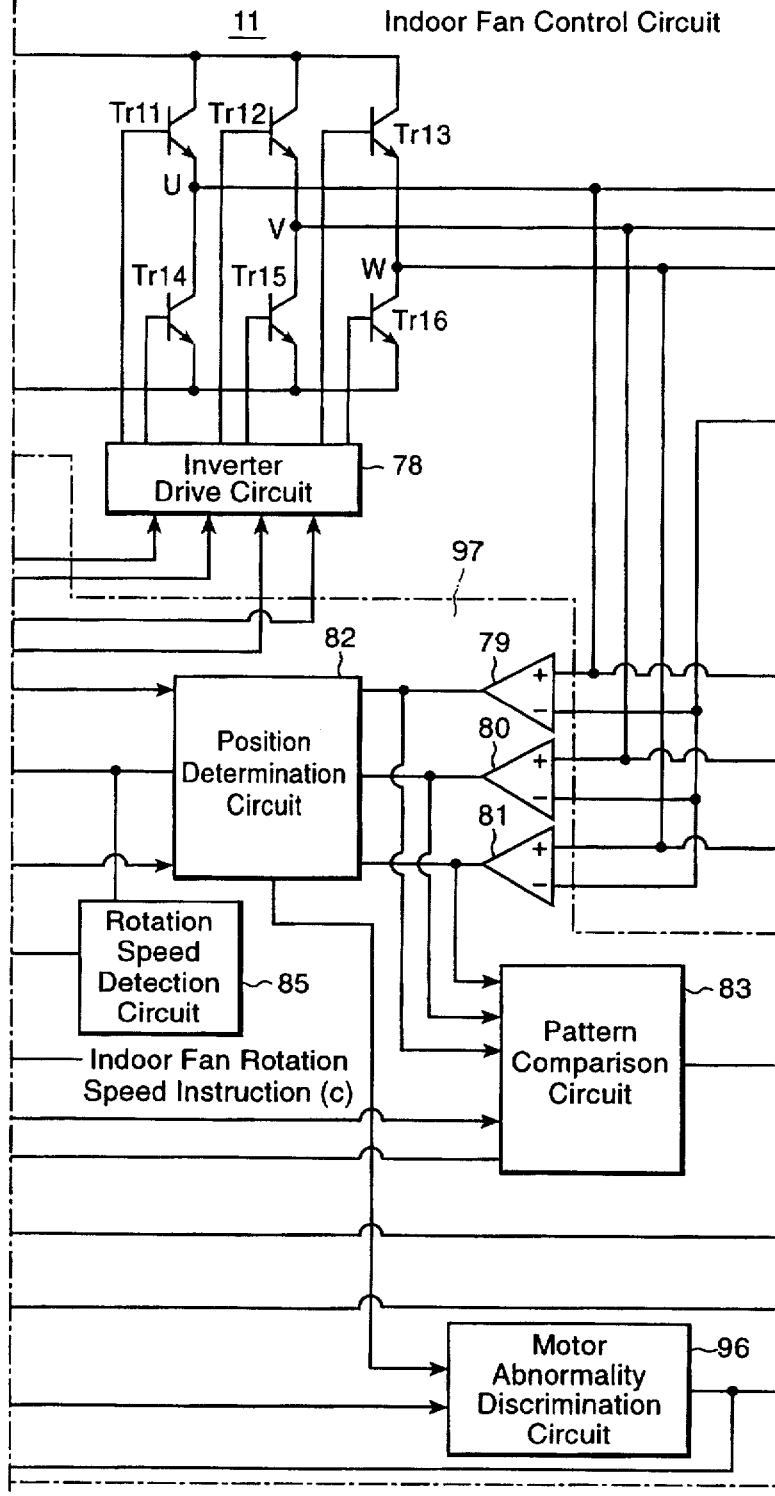
Figure 12A:
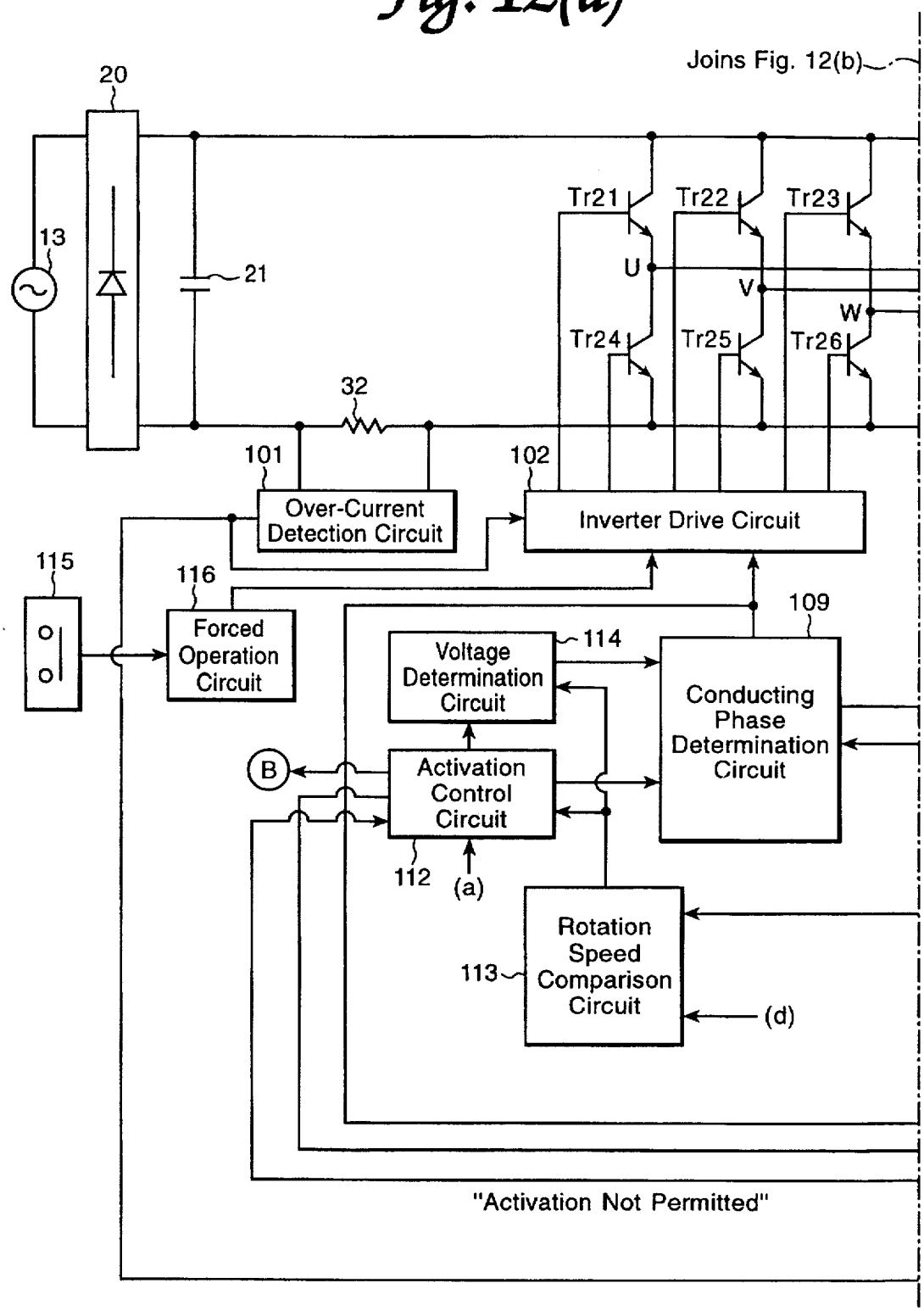
Figure 12B:
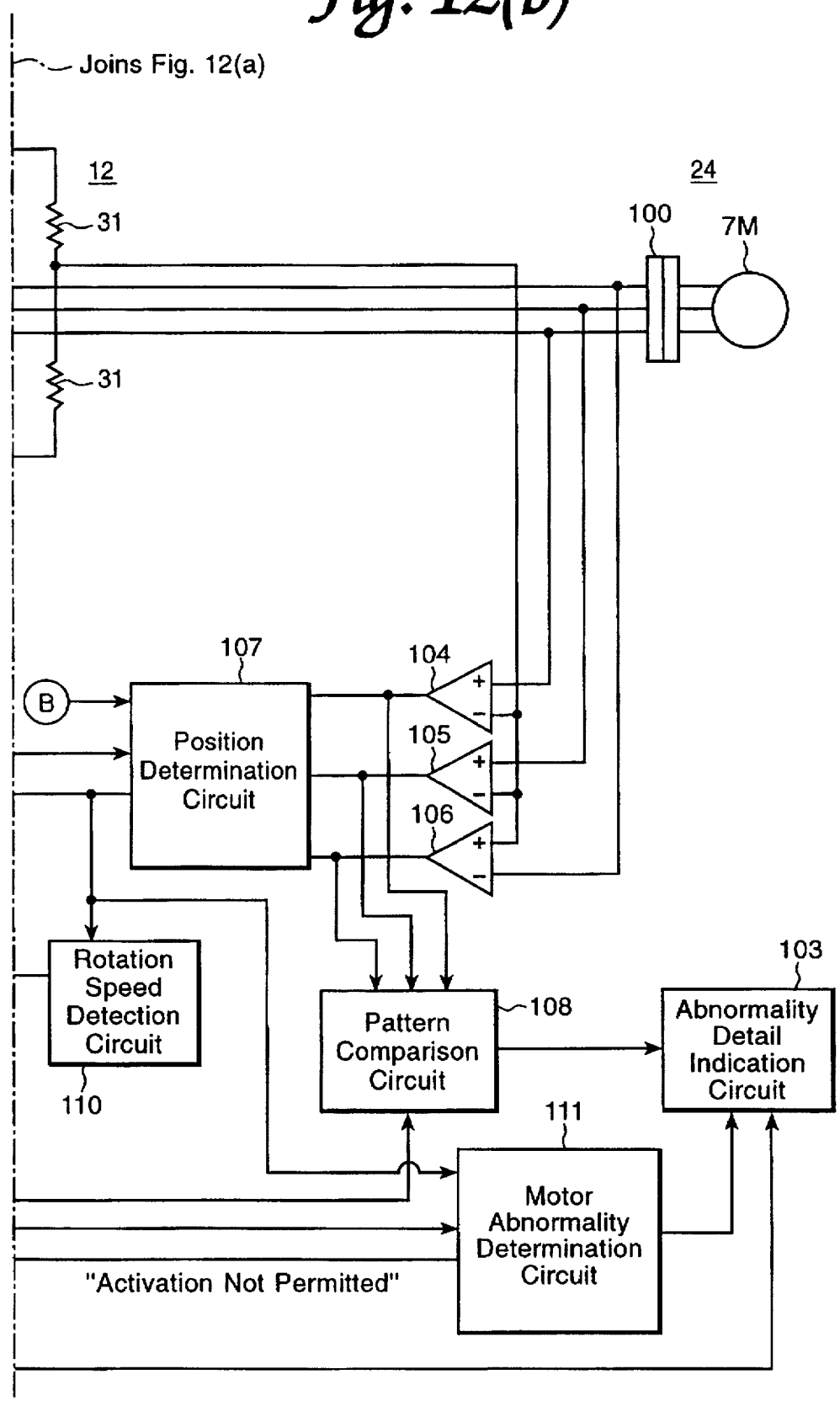

FIGS. 5(a) to 5(f) are time charts of the conduction of an inverter which drives the compressor motor, and induced voltages in the three phase stator windings;

FIGS. 6(a) to 6(c) are timing charts showing the state of PWM control of the inverter;

FIG. 7 is a table showing the relationships between specific conduction patterns and outputs of a compressor rotor position detection circuit before the compressor motor activation;

FIG. 8 is a table showing forced commutation conduction patterns for the compressor motor;

FIG. 9 is a block diagram showing a control circuit for the indoor fan motor;

FIG. 10 is a table showing the relationships between specific conduction patterns and outputs of a indoor fan motor rotor position detection circuit before activation of the indoor fan motor;

FIG. 11 is a table showing modified specific patterns for the specific conduction patterns shown in FIG. 10;

FIG. 12 a block diagram showing a control circuit for an outdoor fan motor; and

FIG. 13 a table showing the relationships between the specific conduction patterns of the outdoor fan motor and outputs of an outdoor fan motor rotor position detection circuit.

DETAILED DESCRIPTION OF THE PREFERRED EMBODIMENTS

The following are descriptions of embodiments of this invention, one embodiment applied as a compressor motor, one embodiment applied as a room indoor fan motor and one embodiment applied as an outdoor fan motor of an air conditioner.

(1) Overall Composition of the Air Conditioner

Figure 1:
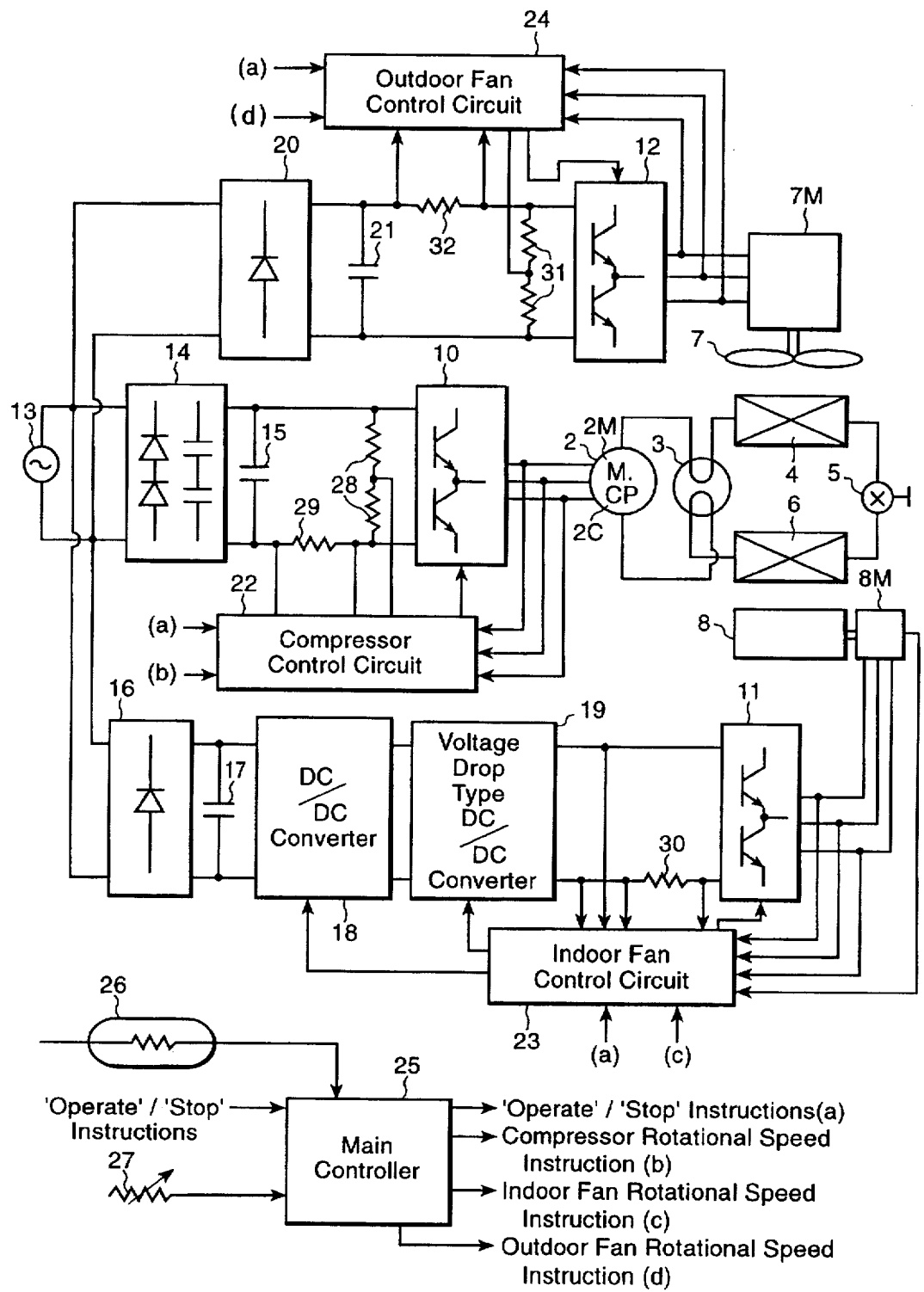
FIG. 1 is an overall block diagram of a control circuit of an air conditioner using an indoor fan DC motor, an outdoor fan DC motor and a compressor DC motor according to the present invention.

The basic composition of an air conditioner including all three embodiments and an outline of each embodiment will be explained with reference to FIG. 1.

The refrigerating circuit of the air conditioner includes compressor 2; four-way valve 3, which switches between a heating position and a cooling position; outdoor heat exchanger 4; expansion valve 5; and indoor heat exchanger 6. Compressor 2 has a sealed case 2a including a compression mechanism 2c and compressor DC motor 2M. DC motor 2M drives compression mechanism 2c. The refrigerant sealed inside circulates through the refrigerating circuit as a result of compression mechanism 2c when compressor 2 is energized. Outdoor fan 7 is provided at outdoor heat exchanger 4. Indoor fan 8 is provided at indoor heat exchanger 6. Indoor fan 8 is driven by indoor fan DC motor 8M. Outdoor fan 7 is driven by outdoor fan DC motor 7M. The rotational speed of compressor 2 is controlled by inverter 10 (hereafter called compressor inverter 10) via compressor DC motor 2M. In the same way, the rotational speed of indoor fan 8 is controlled by inverter 11 (hereafter called indoor fan inverter 11) via indoor fan DC motor 8M, and the rotational speed of outdoor fan 7 is controlled by inverter 12 (hereafter called outdoor fan inverter 12) via outdoor fan DC motor 7M. All of inverters 10 to 12 receive DC power via rectifying circuits, described later, from common AC power source 13. Each of inverters 10 to 12 outputs variable frequency AC power.

Compressor inverter 10 inputs DC power obtained from commercial AC power source 13 via voltage doubler rectifying circuit 14 and capacitor 15. The output of compressor inverter 10, that is variable frequency AC power, is supplied to compressor motor 2M. Thus, compressor inverter 10 can drive compressor 2 via compressor DC motor 2M at variable speed.

Indoor fan inverter 11 inputs DC power obtained from AC power source 13 via rectifying circuit 16, capacitor 17, DC/DC converter 18 and voltage-drop type DC/DC converter 19. Indoor fan inverter 11 converts the DC power to variable frequency AC power. Indoor fan 8 is driven at Variable speed by indoor fan Dc motor 8M.

The circuit to drive the outdoor fan 7 is similar to the circuit to drive compressor DC motor 2M. Outdoor fan inverter 12 inputs DC voltage obtained from AC power source 13 via rectifying circuit 20 and capacitor 21, and converts the DC voltage to a variable frequency AC power. Outdoor fan 7 is driven by outdoor fan DC motor 7M at a variable speed.

Inverters 10 to 12 are respectively controlled by individually provided compressor control circuit 22, indoor fan control circuit 23 and outdoor fan control circuit 24. Main control circuit 25 is provided in common for these control circuits 22 to 24. These control circuits 22 to 24 and main control circuit 25 are respectively composed of microprocessors. These control circuits function in accordance with each microprocessor's individual software which is preinstalled in a memory of each microprocessor.

Main controller 25 transmits 'Operate'/'Stop' instructions (a) to each control circuit 22 to 24, based on 'Operate'/'Stop' instructions transmitted from a remote control unit. At the same time, it transmits compressor rotational speed instructions (b) to compressor control circuit 22 so that the difference between room temperature $T_a$ detected by room temperature sensor 26, for example, a thermistor, and set room temperature $T_s$, set by room temperature setting device 27, that is, temperature deviation $\Delta T$, will approach zero. Main controller 25 further transmits indoor fan rotational speed instructions (c) to control circuit 23 and transmits outdoor fan rotational speed instructions (d) to control circuit 24.

Each DC motor 2M, 7M and 8M, is a synchronous motor having a permanent magnet rotor. Each DC motor 2M, 7M and 8M, together with each position detection device and each inverter 10, 11, 12 (electronic rectifier) forms a brushless DC motor. In this invention, position detection is performed based on the induced voltages in stator windings of DC motors 2M, 7M and 8M, without providing an independent position sensor (in other words "sensorless"). That is, the current conduction combination of the stator windings is set so that one phase is always disconnected from a current supply. Therefore, it is possible to detect the rotor position based on the induced voltage in the non-conducting stator winding at the time of rotor rotation.

The non-conducting phase must be disconnected from the current supply for a sufficient portion of the rotational cycle to permit position detection based on induced voltage. Normally, in a three phase motor, each stator winding, is energized in a series of cycles of positive conduction for an electrical angle of 120°, non-conduction for 60°, negative conduction for 120° and thereafter non-conduction for 60°.

Current detection resistor 29 which has a low resistance, for detecting the input current, and voltage divider resistors 28 are provided on the input side of compressor inverter 10. Voltage divider resistors 28 extract a voltage intermediate of the input DC voltage. The respective detection signals are applied to compressor control circuit 22. The output voltage of compressor inverter 10, e.g., the voltage at the input terminal of compressor DC motor 2M built into compressor 2, is also applied to compressor control circuit 22. Compressor control circuit 22 calculates frequency instructions for compressor inverter 10 based on these input signals, together with 'Operate'/'Stop' instructions (a) and compressor rotational speed instructions (b) to control compressor inverter 10.

The input current for indoor fan inverter 11 is applied to indoor fan control circuit 23 after it is detected via current detector 30, which is composed of a low value resistor. In addition, an input voltage to and an output voltage from indoor fan inverter 11 are input to indoor fan control circuit 23. In indoor fan control circuit 23, the neutral point potential of indoor fan DC motor 8M is generated from the output voltage of indoor fan inverter 11, i.e., the input voltage of indoor fan DC motor 8M. Indoor fan control circuit 23 calculates and outputs control instructions for DC/DC converter 18, voltage-drop type DC/DC converter 19 and indoor fan inverter 11 based on these input voltage values, together with 'Operate'/'Stop' instructions (a) and indoor fan rotational speed instructions (c) to control the indoor fan inverter 11.

For outdoor fan inverter 12, in a manner similar to compressor inverter 10, the input current and the input voltage are respectively detected via low resistance current detection resistor 32 and voltage divider resistors 31, and are applied to outdoor fan control circuit 24. The output voltage of outdoor fan inverter 12 is also applied to outdoor fan control circuit 24. Outdoor fan control circuit 24 controls outdoor fan inverter 12 by calculating and outputting control instructions for outdoor fan inverter 12 based on these input voltage values, together with 'Operate'/'Stop' instructions (a) and outdoor fan rotational speed instructions (d).

Further details of the compositions of the controllers for compressor 2 (compressor DC motor 2M), indoor fan 8 (indoor fan DC motor 8M) and outdoor fan 7 (outdoor fan DC motor 7M), will be explained in that order.

(2) Compressor Control
<Composition of Main Control Circuit and Compressor Control Circuit>

Figure 2A:
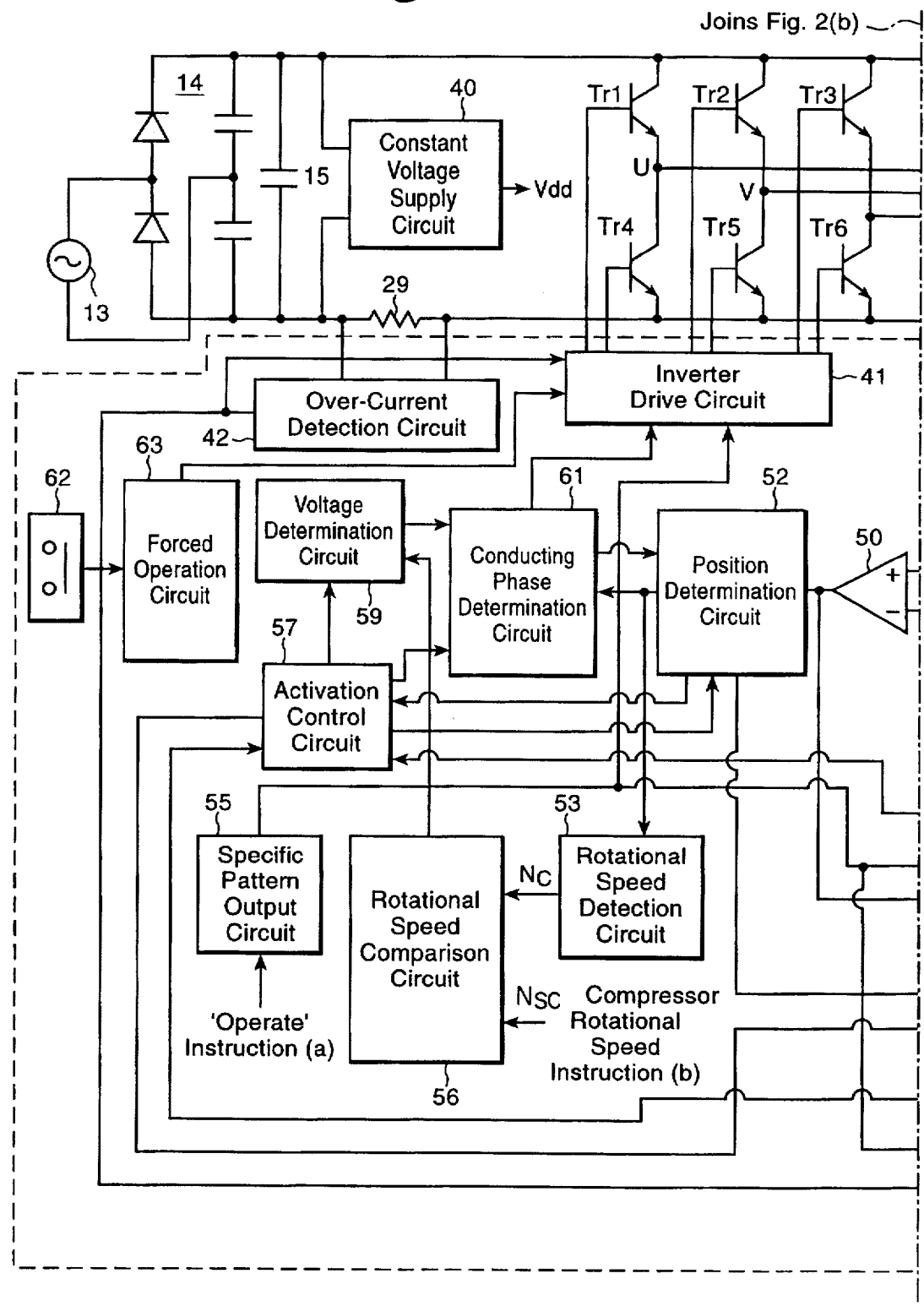
FIG. 2 is a block diagram showing a control circuit for the compressor motor.
Figure 2B:
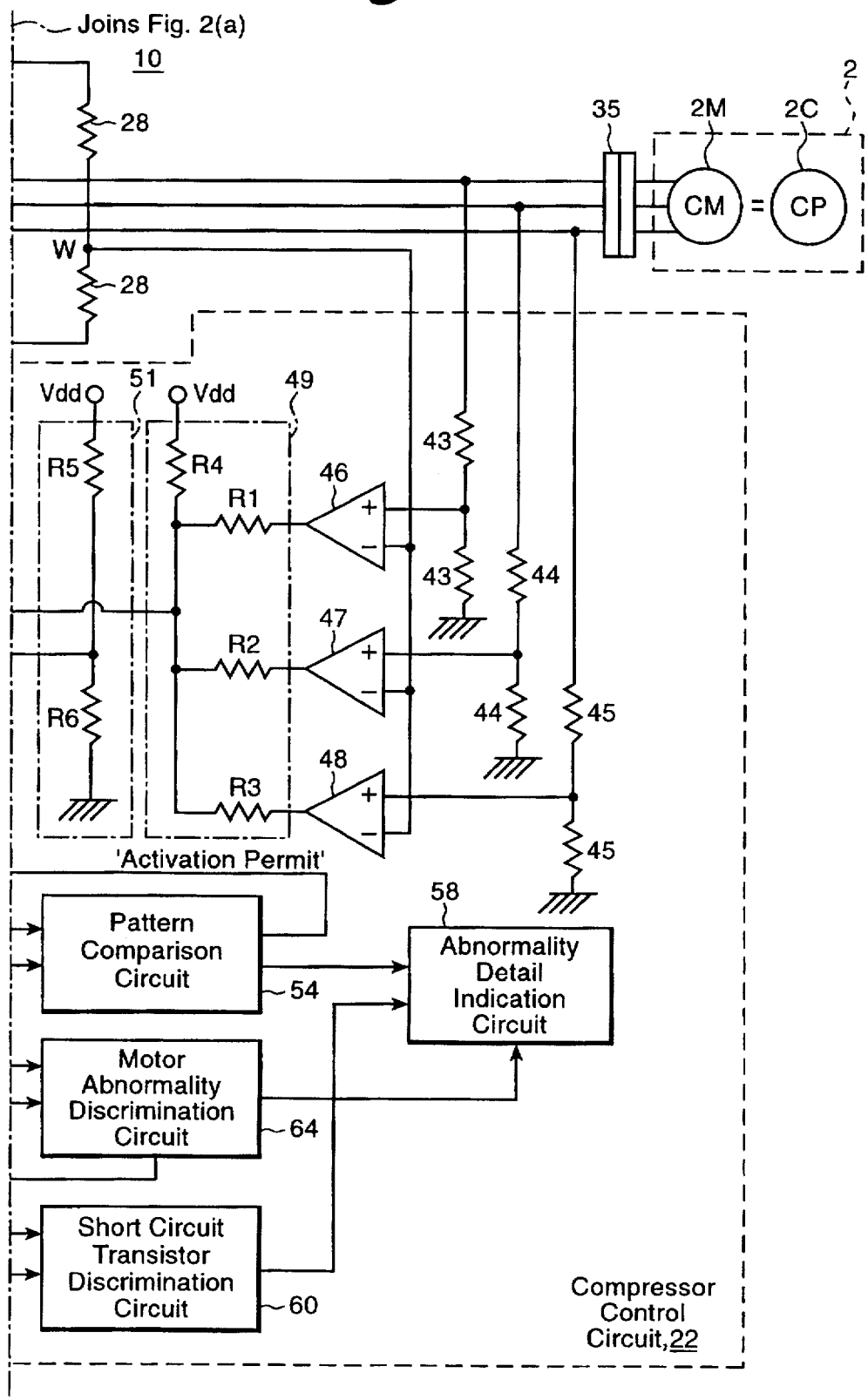

FIG. 2 shows the details of compressor inverter 12, the main system for compressor 2 and compressor control circuit 22.

Figure 3:
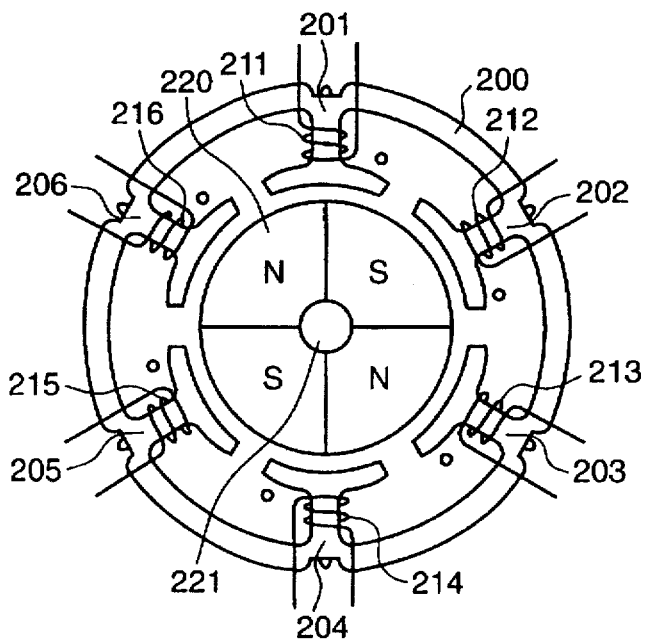
FIG. 3 is a schematic transverse cross-sectional view of the compressor motor.
Figure 4:
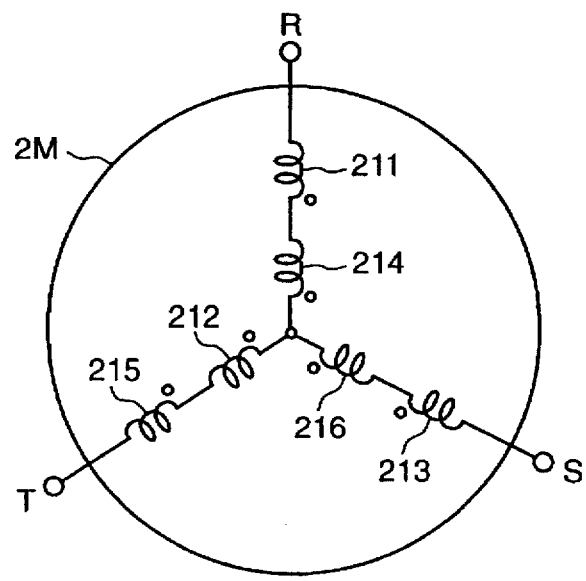
FIG. 4 is a schematic diagram showing the three phase stator winding of the compressor motor.

Compressor 2 includes rotary type compressor mechanism 2C and compressor motor 2M which drives rotary type compressor mechanism 2C. Compressor DC motor 2M is housed inside a sealed case which is common to compressor mechanism 2C. As shown in FIG. 3, compressor DC motor 2M is composed of stator 200 which has 6 salient-pole teeth arranged spatially at 60° intervals and 4-pole rotor 220 having 4 permanent magnets which is rotatably supported inside the stator 200. Three phase stator windings 211 to 216 for applying a rotating magnetic field to rotor 220 are wound on salient-pole teeth 201 to 206. Rotation axis 221 extends through the center of rotor 220. As shown in FIG. 4, three phase windings 211 to 216 are star-connected. The output voltage of compressor inverter 10 is applied to three phase winding terminals R, S and T.

Rectifying circuit 14 is a known voltage doubler rectifying circuit composed of diodes and capacitors. It produces a DC voltage of approximately 280V by voltage doubling rectification of the 100V AC voltage of commercial AC power source 13, and inputs that DC voltage to compressor inverter 10. Compressor inverter 10 together with compressor DC motor 2M compose a brushless DC motor. Connector 35, which functions as a circuit breaker, is provided between compressor inverter 10 and compressor DC motor 2M. Constant voltage supply circuit 40, connected to the output terminals of rectifying circuit 14, generates constant voltage $V_{dd}$. Compressor inverter 10 includes transistors Tr1 to Tr6 and outputs variable frequency AC power from its AC output terminals U, V and W.

As shown in FIGS. 5(a) to 5(c), the voltage supplied to compressor DC motor 2M from compressor inverter 10 repeats a pattern for each phase winding of positive conduction for an electrical angle of 120°, non-conduction for 60°, negative conduction for 120° and non-conduction for 60° during one cycle. It is set to maintain a phase difference of 120° between each phase. In this way, when compressor DC motor 2M is rotating, induced voltages r, s and t, which vary from a first state to a second state or from the second state to the first state, are generated in each phase winding during the non-conducting periods, as shown in FIGS.5(d) to 5(f). Therefore, time period $t_0$ from the switch-OFF time of two transistors which form one phase of compressor inverter 10, until the induced voltage of the phase crosses a reference voltage during this non-conduction period, is measured. Specified transistors are switched ON or OFF after the time period $t_0$ has elapsed from the time the induced voltage crosses the reference voltage. For example, as shown in FIGS. 5(c) and 5(f), time period $t_0$ is measured from the switch-OFF time point of transistor Tr6 (W phase negative side=T phase winding negative voltage) until the T phase induced voltage crosses the reference voltage. After the measurement, of transistor Tr1 is switched OFF (U phase positive side=R phase winding positive voltage) and transistor Tr3 is switched ON (W phase positive side=T phase winding positive voltage) when the time period $t_0$ has passed from the point in time when the induced voltage crosses the reference voltage. In this way sensorless DC motor control can be performed by rotor position detection.

The above theoretical description corresponds to the principle of commutatorless sensorless DC motor control. In practice, in compressor inverter 10, one of a pair of transistors for one phase is energized to provide a pulse width modulated (PWM) current to DC motor 2m in order to control the compressor rotational speed. Therefore, each phase voltage $V_r$, $V_s$, and $V_t$ of the motor windings is as shown in FIGS. 6(a)–6(c). In this case, during the non-conduction period (angle), the phase voltage is changed by the PWM switching of the transistor. However, induced voltages can be detected based on non-conduction phase voltage $V_r$, $V_s$ or $V_t$. Time period $t_0$ is measured as the time from the start of a non-conduction period (points A) until the induced voltage of the non-conduction phase becomes half of the input DC voltage of compressor inverter 11, that is the neutral point potential of the input DC voltage (point P), during this non-conduction period. Then, specified transistors are switched ON or OFF after the time period $t_0$ has elapsed from the time the induced voltage became half of the input DC voltage.

Compressor control circuit 22 is provided with over-current detection circuit 42, which detects over-currents in the input circuit of compressor inverter 10 based on the voltage drop across current detection resistor 29. Inverter drive circuit 41 drives transistors Tr1 to Tr6 of compressor inverter 10. The detection output signals of over-current detection circuit 42 are transmitted to inverter drive circuit 41 and short circuit transistor discrimination device 60. The phase output terminal potentials of compressor inverter 10, obtained via voltage divider resistors 43, 44 and 45, are compared in comparators 46, 47 and 48 with the neutral point potential of the input DC voltage provided by voltage divider resistors 28. These comparison result signals are input to a comparison input terminal of comparator 50 via voltage divider circuit 49. Voltage divider circuit 49 is composed of resistors R1, R2 and R3, which are connected in series to each output terminal of comparators 46, 47 and 48, and resistor R4 which is connected in common between the other terminals of reSistors R1, R2 and R3 and the constant DC voltage $V_{dd}$ terminal. The node of resistor R4 and resistors R1, R2 and R3 is connected to the input terminal of comparator 50. A reference voltage for comparison, which is obtained from constant DC voltage $V_{dd}$ by voltage divider circuit 51, composed of resistors R5 and R6, is input to a reference input terminal of comparator 50. A position detection circuit which detects a rotor position of compressor motor 2M is composed of voltage divider resistors 43 to 45 and comparators 46 to 48 and 50, and voltage divider circuits 49 and 51. Voltage divider circuits 49 and 51 and comparator 50 form a majority decision circuit (described hereafter) in which the output of comparator 50 depends on the state of the outputs of the majority of comparators 46–48.

In order to provide an accurate indication of when the induced voltages change state, the voltage between voltage divider resistors 28 should be one-half of the difference between the maximum and minimum voltages developed between the resistors of dividers 43,.44 and 45. As practical examples of the values of the voltage divider resistors, resistor 28 connected to the higher voltage is 560 kΩ, and resistor 28 connected to the lower voltage is 20 kΩ. The resistor of each of dividers 43–45 which is connected to a motor winding is 270 kΩ, and the other resistor of each divider 43Ω45 is 20 kΩ. AlSo, in resistor circuit 49 and voltage divider circuit 51, R1=R2=R3=100 kΩ, R4=75 kΩ and R5=R6=82 kΩ.

In this embodiment, a voltage which is ½ of voltage $V_{dd}$ is input to the reference input terminal of comparator 50. The respective output terminals of comparators 46 to 48 are functionally cut off from resistor R4 at the time of the H output because of an 'open collector' (or 'open drain') configuration, and at the time of the L output the output terminals are connected to resistor R4. Therefore, when one of comparators 46 to 48 has a H output and the other two have L outputs, the H output comparator becomes cut off from voltage divider circuit 49. The output terminal resistors of the two L output comparators are parallel. Thus, their total resistance value becomes halved (in the case of the above example, 50 kΩ). As a result, the comparison input to comparator 50 becomes $(50/(50+75))*V_{dd}(<(½)*V_{dd})$. Accordingly, the value is less than the reference voltage $(½)*V_{dd}$. Thus, the output of comparator 50 becomes L. When two of comparators 46 to 48 have H outputs and the other has a L output, the comparison input to comparator 50 becomes $(100/(100+75))*v_{dd}(>(½)*V_{dd})$. Accordingly, the value is greater than the reference voltage $(½)*V_{dd}$. As a result, the output of comparator 50, becomes H. In this way, a majority decision circuit is formed by voltage divider circuits 49, 51 and comparator 50, in which the output of comparator 50 depends on the state of the outputs of the majority of comparators 46–48.

The rotor position of compressor DC motor 2M is determined by position determination circuit 52 based on the output of comparator 50, or the output of the majority decision circuit. Position determination circuit 52 is connected to activation control circuit 57, rotational speed detection circuit 53 and pattern comparison circuit 54. 'Operate' instruction (a), transmitted from main control circuit 25, is input to specific pattern output circuit 55, and compressor rotational speed. instructions (b) are input to rotational speed comparison circuit 56. When specific pattern output circuit 55 has received 'Operate' instruction (a), specific pattern output circuit 55 transmits specific drive patterns, described later, to inverter drive circuit 41, pattern comparison circuit 54 and short-circuit transistor discrimination circuit 60. For example, specific pattern output circuit 55 outputs six signals, one to control each of transistors TR1–TR6 through drive circuit 41. Pattern comparison circuit 54 compares the specific patterns input from specific pattern output circuit 55 with the comparison output of comparator 50, or output of majority decision circuit. As a result to this comparison, pattern comparison circuit 54 transmits an 'Activation Permit' signal to activation control circuit 57 or an 'Abnormality' signal to abnormality detail indication circuit 58. When activation control circuit 57 receives an 'Activation Permit' signal from pattern comparison circuit 54, it transmits activation control signals for voltage determination circuit 59 and conducting phase determination circuit 61.

When short-circuit transistor discrimination circuit 60 discriminates a short-circuit transistor in compressor inverter 10, based on the specific pattern signals output from specific pattern output circuit 55 and an abnormality detection signal from over-current detection circuit 42, short circuit transistor discrimination circuit 60 transmits that discrimination signal to abnormality detail indication circuit 58. As will be described below, the specific drive patterns include two conduction patterns for detecting the short-circuit of compressor inverter 10. In one pattern, all of the positive side transistors Tr1 to Tr3 are turned on and all of the negative side transistors Tr4 to Tr6 are turned off (pattern a) shown in FIG. 7). In the other pattern, all of the positive side transistors Tr1 to Tr3 are turned off and all of the negative side transistors Tr4 to Tr6 are turned on (pattern b) shown in FIG. 7). If an abnormality signal, i.e., an over-current detections signal, is transmitted from over-current detection circuit 42 while these two conduction patterns are supplied to compressor inverter 10, short-circuit transistor discrimination circuit 60 detects the short-circuit by receiving the abnormality signal and the two conduction patterns described above transmitted from specific pattern output circuit 55. Furthermore, short-circuit transistor discrimination circuit 60 distinguishes pattern a) from b), and determines which side of the transistors is short-circuited based on the distinction. Short-circuit transistor discrimination circuit 60 is easy to construct using logic circuits, such as exclusive OR and AND logic circuits.

When a forced operation instruction is transmitted from forced operation switch 62, that is transmitted to inverter drive circuit 41 via forced operation circuit 63, compressor 2 is forcibly operated via compressor inverter 10. When a motor abnormality is discriminated by motor abnormality discrimination circuit 64 based on the output of position determination circuit 52 and the output of activation control circuit 57, that discrimination signal is transmitted to abnormality detail indication circuit 58 to indicate the abnormality detail. It is also transmitted to activation control circuit 57 as an 'Activation Not Permit' signal.

As indicated above, compressor control circuit 22 can be achieved by a microprocessor programmed with appropriate software or with logic circuits.

The operation of the above described circuit configuration will now be explained.

<Specified Pattern Output Before Activation>

When the air conditioner receives an 'Operate' instruction from the user via the remote control unit, main control circuit 25 supplies 'Operate' instruction (a) to specific pattern output circuit 55 in compressor control circuit 22. Specific pattern output circuit 55 transmits specified three phase output patterns, which have been preset or stored in the compressor control circuit 22, to inverter drive circuit 41. The specified three phase output patterns are shown in FIG. 7. First, pattern a) is output for a period of 50 ms (milliseconds). Then, after a stopped period of 20 ms has elapsed, output of the next pattern b) is performed for a 50 ms period. Thereafter, outputs are performed in sequence up to pattern f).

<Detection for Compressor Inverter 10 Short-Circuit Abnormality>

Pattern a) and Pattern b) are for detecting short-circuit abnormalities of transistors Tr1 to Tr6 in compressor inverter 10. When over-current detection circuit 42 detects an over-current during the output of these patterns, it is determined that a transistor short-circuit abnormality exists. At the same time, short-circuit transistor discrimination circuit 60 discriminates whether the short-circuit transistor is in the positive arm transistors (Tr1 to Tr3) or in the negative arm transistors (Tr4 to Tr6) based on the specific pattern a) and b). That is say, if over-current is detected during the output pattern a), at least one of positive arm transistors (Tr1 to Tr3) is short-circuited. While if over-current is detected during the output pattern b), at least one of negative arm transistors (Tr4 to Tr6) is short-circuited. The transistor short-circuit abnormality and the positive side/negative side discrimination result are displayed by abnormality detail indication circuit 58 based on the discrimination result by short-circuit transistor discrimination circuit 60.

At the same time, at the moment that over-current detection circuit 42 has detected an over-current, it immediately transmits a conduction prohibition instruction to inverter drive circuit 41 so that the damage will not spread further. By this conduction prohibition instruction, inverter drive circuit 41 does not drive transistors Tr1 to Tr6 of compressor inverter 10 until the conduction prohibition instruction has been reset after completion of repairs. For this reason, in the case that over-current detection circuit 42 detects an over-current during the output patterns a) or b), patterns c) to f) are not thereafter executed.

When transistors Tr1 to Tr6 are assembled in one package, all transistors Tr1 to Tr6 will be replaced, taking the package as a unit, at the time of repair and service. Thus, specification of the broken-down transistor is not required. Therefore, only the fact that there is a transistor short-circuit abnormality need be displayed by abnormality detail indication circuit 58.

<Detection of Position Detection Circuit or Inverter Drive Circuit 41 Abnormality>

When no over-current has been detected during the output of pattern a) or b), there is no short-circuit abnormality in transistors Tr1 to Tr6. Therefore, specific pattern output circuit 55 sequentially outputs specific patterns c) to f). When both the position detection circuit and inverter drive circuit 41 can operate normally, comparators 46 to 48 for each phase, in response to specific patterns c) to f), are as shown in FIG. 7. Therefore, the output of comparator 50 in the following stage will also be determined as either "H" or"L" as shown in FIG. 7.

In pattern comparison circuit 54, the normal output of the position detection circuit, or the output of comparator 50 shown in FIG. 7 is preset according to the specific patterns output from specific pattern output circuit 55. Pattern comparison circuit 54 determines an agreement/disagreement of the normal output with the actual output of comparator 50 at each pattern. Here, if both outputs agree, the position detection circuit is normal. Therefore, pattern comparison circuit 54 outputs an 'Activation Permit' signal to activation control circuit 57. The position detection circuit mentioned here includes voltage divider resistor 28, and comparators 46 to 48, and 50.

When there is a difference between the two outputs during the output of specific patterns c) to f), pattern comparison circuit 54 generates an abnormality output, indicating that there is an abnormality in the position detection circuit or inverter drive circuit 41. This abnormality output is transmitted to abnormality detail indication circuit 58 as a position detection circuit abnormality or a drive circuit abnormality. Then, abnormality detail indication circuit 58 displays the fact that there is a position detection circuit abnormality or an inverter drive circuit abnormality. In this case, 'Activation Permit' signal is not input to activation control circuit 57. Therefore, compressor 2 does not operate, and its stopped state is maintained.

When the position detection circuit and inverter drive circuit 41 are positioned on the same circuit board, there is no need to discriminate between these two abnormalities. However, when they are mounted on separate substrates and connected via a connector, it is desirable to distinguish between these abnormalities so that the correct defective component can be replaced. For this reason, determination of whether the position detection circuit or inverter drive circuit 41 can be made by the following process. <Discrimination Between Position Detection Circuit Abnormality and Inverter Drive Circuit Abnormality>

The service engineer removes connector 35 which connects the output wiring between compressor DC motor 2M with compressor inverter 10, and presses forced operation switch 62. Then, the 'Forced Operation' instruction is transmitted from forced operation switch 62 to forced operation circuit 63. When forced operation circuit 63 receives the 'Forced Operation' instruction, forced operation circuit 63 transmits forced commutation signals for controlling transistors TR1–TR6 through inverter drive circuit 41. Then, inverter drive circuit 41 outputs a specified output pattern to the transistors Tr1 to Tr6 of compressor inverter 10 (such as patterns m1–m6 illustrated in FIG. 8 and described below) so that compressor DC motor 2M would rotate at about 30 rps and each phase voltage from inverter 10 would be almost the same value based on the forced commutation signal.

The phase voltages of inverter 10 are controlled by PWM conduction of part of the drive phase, described later. Here, the service engineer checks the mean inter-phase voltages U-V, V-W and W-U, at an inverter side terminal of the removed connector 35 by using a tester or the like. When these mean inter-phase voltages are approximately the same, transistors Tr1 to Tr6 of compressor inverter 10, and inverter drive circuit 41 are operating normally. Therefore, it can be deduced that the position detection circuit (comparators 46 to 48 and 50) has failed. Then the service engineer can replace the position detection circuit (comparators 46 to 48 and 50).

When the inter-phase voltages vary by more than a permissible value, there is an open-phase abnormality in at least one of transistors Tr1 to Tr6 or in inverter drive circuit 41. As a result, it can be deduced that compressor inverter 10 or inverter drive circuit 41 are abnormal. Whether the compressor inverter is malfunctioning or the drive circuit is malfunctioning can be determined by measuring the drive voltage from inverter drive circuit 41 which is applied to each transistor Tr1 to Tr6 using the tester. When a voltage of approximately 5V is applied to each transistor being driven, inverter drive circuit 41 is normal. Consequently, at least one of transistors Tr1 to Tr6 has an open-circuit abnormality. If sufficient drive voltage is not applied to the transistors, inverter drive circuit 41 is abnormal. Based on the above results, the service engineer can swiftly complete repair by replacing the failed circuit component.

Forced operation circuit 63 stops generating the forced commutation signal at a time which is sufficient for the service engineer to have measured the inter-phase voltages and the drive voltage from inverter drive circuit 41 which is applied to transistors Tr1 to Tr6, for instance, about 1 minute. Furthermore, forced operation circuit 63 can stop generating the forced commutation output when operation switch 62 is pressed during the forced operation. Thus, the service engineer can stop the forced operation midway by forced operation switch 62 being pressed once more.

In the above way, short-circuit and open-circuit abnormalities of transistors Tr1 to Tr6, together with abnormalities of the position detection circuit (comparators 46 to 48, 50) and of inverter drive circuit 41 can be determined.

<Normal Activation>

(i) Outline of Normal Operation

After the inspection described above, if no abnormality is detected, an 'Activation Permit' signal from pattern comparison circuit 54 is input to activation control circuit 57. At the same time, rotational speed detection circuit 53 calculates and outputs compressor rotational speed Nc, based on the output of position determination circuit 52. Rotational speed comparison circuit 56 compares compressor rotational speed Nc with setting compressor rotational speed Nsc designated in compressor rotational speed instruction (b) from main control circuit 25. An output corresponding to this comparison result, that is a output voltage up or down signal, is supplied to voltage determination circuit 59. Before the activation of compressor, compressor rotational speed Nc output by rotational speed detection circuit 52 is 0 because there is no position detection output. After the activation, compressor rotational speed Nc output by rotational speed detection circuit 52 increases according to the compressor rotational speed increase. When compressor rotational speed Nc is larger than setting compressor rotational speed Nsc, rotational speed comparison circuit 56 outputs an output voltage down signal to voltage determination circuit 59, while when compressor rotational speed Nc is less than setting compressor rotational speed Nsc, rotational speed comparison circuit 56 outputs an output voltage up signal to voltage determination circuit 59. The compressor speed control corresponding to the output of rotational speed comparison circuit 56 is described later.

(ii) Forced Commutation

At the commencement of activation control operation, activation control circuit 57 starts a timer which counts 30 seconds. During this time, activation control circuit 57 instructs voltage determination circuit 59 to output an activation voltage. As long as voltage determination circuit 59 has this input, voltage determination circuit 59 ignores the signals supplied from rotational speed comparison circuit 56, and supplies a variable width PWM conduction signal to specific conducting phase transistors so that the specified voltage is output from compressor inverter 10 to compressor DC motor 2M. The specified voltage generated by this PWM conduction is set so that the voltage gradually increases in proportion to time to become about 60V after 30 seconds.

At the same time, activation control circuit 57 supplies an instruction to conducting phase determination circuit 61 so that it executes a forced commutation at the time of activation. The output of conducting phase determination circuit 61 is conducted to each individual transistor for the period of an electrical angle of 120° by shifting each phase 120°, both during the forced commutation operation and during normal commutation by position detection. Thus, during each of a number of periods, stator windings 211 to 216 of one phase of compressor DC motor 2M always become non-conducting and stator windings 211 to 216 of one phase become PWM conductive.

This forced commutation is performed according to a conduction pattern (switching state of Tr1 to Tr6) shown in FIG. 8. Conducting phase determination circuit 61 first starts conduction in pattern m1). Then, it sequentially repeats from pattern m1) to pattern m6) at specified time intervals, unrelated to position detection. This forced commutation is first started at a low frequency, that is, at long conduction intervals. Then, the conduction interval gradually shortens and is finally set so that it becomes an output by which compressor DC motor 2M rotates at about 20 rps.

(iii) Start of Position Detection

This forced commutation operation ends at 30 seconds after activation which is counted by the timer operated by activation control circuit 57. Two to three seconds before the completion, that is when a 27 to 28 second period has elapsed after the start of forced commutation, activation control circuit 57 supplies an operation start output to position determination circuit 52. By receiving this signal, position determination circuit 52 starts to detect the compressor rotor position on the output of comparator 50.

Comparators 46 to 48, which compare the intermediate potential of the DC power source voltage and the voltages of each stator winding, output an H output when the corresponding winding is connected to a high voltage (phase H), and output an L output when the corresponding winding is connected to a low voltage (phase L). At any time, one winding is always connected to phase H and one winding is always connected to phase L when PWM is ON during normal operation. At this time one of the phase H and phase L is driven with a constant voltage and the other is driven with a PWM signal. When phase H is driven with the PWM signal one of the positive side transistors Tr1 to Tr3 is driven with a PWM signal. When phase L is driven with the PWM signal, one of the negative side transistors Tr4–Tr6 is driven with a PWM signal.

The outputs of comparators 46 to 48 are shown in FIG. 8. In the FIG. 8, the "*" symbol indicates the comparator output corresponding to the PWM conduction phase. "H" or "L" after the "*" symbol indicates that the winding connected to that comparator is being driven with the PWM signal from phase H or phase L, respectively. The remaining comparator is connected to the non-conducting stator winding. The comparator compares the voltage generated in the stator winding by the rotation of the permanent magnets mounted in the rotor, or induced voltage, with the intermediate potential of the DC power source voltage. Therefore, the output of the comparator changes from H to L or from L to H at the passing of the point at which the magnetic poles of the permanent magnet change. This directional change is shown in FIG. 8 by "H→L" or "L→H".

Comparator 50, to which the outputs of these three comparators 46 to 48 are input via voltage divider circuits 49 and 51, outputs an H output when two of the outputs of the three comparators are H and one is L. After that, the output of comparator 50 changes from H to L as the output of the non-conducting phase comparator changes from H to L. In the period when PWM is ON, the time at which the output of comparator 50 changes is the moment at which a magnet crosses the non-conducting phase. Therefore, position determination circuit 52 can ultimately detect the rotational position of rotor 220 by the detection of the instant of change in the output of comparator 50. Consequently, position determination circuit 52 can detect the rotational position of rotor 220 based only on the output of comparator 50 and the PWM OFF timing.

Furthermore, position determination circuit 52 judges whether the output of comparator 50 repeatedly changes correctly from "H" to "L", or the reverse, within a specified time after each conduction phase change, as it should during forced commutation. If the discrimination result is normal, commutation by position detection based on the detection output of the position detection circuit is started from the point of completion of forced commutation operation.

(iv) Commutation by Position Detection

For commutation by position detection, position determination circuit 52 counts the time from the previous position detection to the next position detection (equivalent to an electrical angle of 60°). Then, position determination circuit 52 halves the time, and stores the halved time (equivalent to an electrical angle of 30°). At the same time, position determination circuit 52 begins counting again. When the counted time has reached the halved time after the previous position detection, position determination circuit 52 outputs a conduction switching signal to conducting phase determination circuit 61. Conducting phase determination circuit 61 switches conduction to the next conducting phase based on the conduction switching signal. That is say, conducting phase determination circuit 61 changes the outputs from the current commutation pattern to the next commutation pattern. For example, if the current commutation pattern is pattern m1), the next pattern m2) would be output, while if the current commutation pattern is pattern m6), the next pattern m1) would be output.

Position determination circuit 52 also outputs a signal to rotational speed detection circuit 53 every time the rotor position is detected, that is say the instant that the output of comparator 50 changes for the non-conduction phase. Rotational speed detection circuit 53 detects the time period from the previous position detection to the current position detection, and calculates the rotational speed of compressor DC motor 2M based on this time period. The time period from the previous position detection to the current position detection is equivalent to an electrical angle of 60°. In a 4-pole rotor motor as compressor motor 2M, rotation is an electrical angle of 360°×2=720°. Therefore, 12 repetitions of this time (60°) (720÷60=12) is the time T of 1 revolution of the motor. Also, the reciprocal of the time T of 1 revolution of the motor (=1/T) is the rotational speed Nc (rps) of the motor. By this calculation, rotational speed detection circuit 53 obtains compressor rotational speed Nc of compressor motor 2M.

(v) Rotational Speed Control (Voltage Control(PWM))

Compressor rotational speed Nc detected by rotational speed detection circuit 53 is compared by rotational speed comparison circuit 56 with setting compressor rotational speed Nsc designated in compressor rotational speed instruction (b) from main control circuit 25. If Nc>Nsc, rotational speed comparison circuit 56 outputs an 'Decrease Voltage' instruction to voltage determination circuit B9. On the other hand, if Nc<Nsc, it outputs a 'Increase Voltage' instruction to voltage determination circuit 59, and if Nc=Nsc, it outputs a 'Maintain Same Voltage' instruction.

Consequently, when actual compressor rotational speed Nc is lower than instructed setting rotational speed Nsc, voltage determination circuit 59 increases the output voltage by increasing the PWM conduction duty ratio of the conducting phase. While, when actual compressor rotational speed Nc is higher than instructed setting rotational speed Nsc, voltage determination circuit 59 decreases the output voltage by decreasing the PWM conduction duty ratio of the conducting phase.

Accordingly, if position detection is correctly performed within 30 seconds from the start of forced commutation, commutation by position detection will be commenced after 30 seconds have elapsed. From this time, the voltage applied to compressor DC motor 2M will be controlled based on the result of the comparison of instructed setting rotational speed Nsc and actual compressor rotational speed Nc.

At this time, instructed setting rotational speed Nsc will be higher than actual compressor rotational speed Nc. Therefore, 'Increase Voltage' instruction is supplied from rotational speed comparison circuit B6 to voltage determination circuit 59. By this instruction, the voltage applied to compressor DC motor 2M, that is, the PWM conduction duty ratio, is altered so that it becomes larger. When this voltage becomes higher, the compressor motor torque increases, and compressor rotational speed Nc begins to rise. When compressor rotational speed Nc rises, the position detection interval shortens and commutation based on position detection also speeds-up in response to this. As a result, when compressor rotational speed Nc ultimately agrees with setting rotational speed Nsc, the PWM duty ratio becomes constant and thereafter stable operation will be performed.

When setting rotational speed Nsc is reduced or when actual compressor rotational speed Nc increases above setting rotational speed Nsc due to a decrease in the air conditioning load, a 'Decrease Voltage' instruction is supplied from rotational speed comparison circuit 56 to voltage determination circuit 59. The PWM duty ratio becomes smaller, and the output voltage of compressor inverter 10 reduces. Thus, the position detection interval lengthens and position detection commutation also lengthens in response to this.

Consequently, compressor rotational speed Nc is stabilized at instructed setting rotational speed Nsc.

<Activation Malfunction Abnormality>

The description above relates to a normal activation operation. However, if compressor 2 is constrained, rotor 220 of compressor motor 2M cannot rotate. Therefore, an output of the position detection circuit cannot be obtained during the forced commutation operation at the time of activation. That is, even if the commutation operation is repeated, the outputs of comparators 46 to 48 of the position detection circuit will not change within the specified time because the induced voltage is not generated when magnetic rotor 220 does not rotate. In this situation, position determination circuit 52 determines that normal position detection has not been performed. As a result, position determination circuit 52 outputs a signal indicating that position detection cannot be performed to motor abnormality discrimination circuit 64. When 30 seconds has elapsed from the activation of compressor DC motor 2M, activation control circuit 57 outputs a 30 seconds elapsed signal to motor abnormality discrimination circuit 64. When both these signals are input, motor abnormality discrimination circuit 64 transmits a motor abnormality signal which indicates that compressor DC motor 2M cannot be rotated due to a constriction, or the like, to abnormality detail indication circuit 58. Then abnormality detail indication circuit 58 displays that the motor is abnormal. Also, when motor abnormality is determined, motor abnormality discrimination circuit 64 transmits an 'Activation Not Permitted' signal to activation control circuit 57 to prohibit further operation.

The compressor drive motor can suffer activation failure due to excess load. Therefore, when the above activation failure is repeated any number of times, it may be considered as an abnormality of compressor DC motor 2M. In that case, the motor is temporarily stopped after the initial 30 seconds activation operation. Thereafter, activation is repeated by activation control circuit 57 once more. Then, when position detection cannot be performed, even if this is repeated any number of times, motor abnormality discrimination circuit 64 determines that compressor DC motor 2M is faulty.

In the embodiment described above, the induced voltage of a non-conducting stator winding is directly input to a comparator, and the comparison output is used as a position detection signal. Then, the conducting phase is switched at a point in time delayed 30° from the point of detection. However, as disclosed in Japanese Patent Kokai Showa 59-36519, the induced voltage of the non-conducting stator winding can be applied to a filter circuit that creates a delay of 90°. The output of the filter circuit is then input to the comparator as a position detection signal. In this case, the comparator output has a 90° delay because of the filter circuit. Therefore, it is necessary to add a slight time delay from conduction until a judgement is made of the normality/abnormality of the comparator output. Also, during normal operation, at the same time as the comparator output changes, conduction is switched to the next pattern.

Furthermore, in this embodiment, the time delay for changing the conducting pattern is a time which is equivalent to an electrical angle of 30° However, a shorter time period, for example, equivalent to an electrical angle of between 20° and 30° can be used in order to increase the motor torque or its rotational speed. Also, the time delay for changing the conducting pattern can be changed based on the rotational speed of the DC motor.

(3) Indoor Fan Control
<Composition of Main Circuit and Control Circuit>

The following is a description of the details of the main system of indoor fan 8 and indoor fan control circuit 23, with reference to FIG. 9.

Indoor fan 8 is a cross-flow fan. Indoor fan DC motor 8M which drives indoor fan 8 is a synchronous motor having a number of permanent magnets in the rotor. It is provided with 3-phase windings on the stator. The stator windings are star connected, and wire 70 is connected to its neutral point N so that the potential of the neutral point can be monitored.

Rectifier 16 rectifies the AC voltage received from AC power source 13. The rectified DC voltage is stabilized by capacitor 17. Then, variable duty ratio DC/DC converter 18 converts the DC voltage to a high stability constant DC voltage, for example about 20 to 50V DC voltage. DC/DC converter 18 is a single transistor type DC-AC conversion circuit which includes switching transformer 181 and switching transistor 182 which is connected in series to its primary winding, half-wave rectification circuit 183, made of a diode and a capacitor, and switching pulse generator 184 which controls the switching of transistor 182. The output voltage of DC/DC converter 18 is detected by voltage detection circuit 73. The duty ratio of switching transistor 182 is controlled by switching pulse generator 184 so that the detected voltage becomes a constant value. Constant voltage supply circuit 74 is connected to a tertiary winding of switching transformer 181. Constant voltage supply circuit 74 generates constant control voltage $V_{dd}$, used in control circuit 23. The output DC voltage of DC/DC converter 18 is supplied to voltage-drop type DC/DC converter 19.

Voltage-drop DC/DC converter 19 alters the output DC voltage of converter 18 based on an instruction from voltage determination circuit 77. Voltage-drop DC/DC converter 19 includes switching transistor 191 for chopping, which is connected to the circuit in series, smoothing circuit 192, which is connected to its output stage, and switching pulse generator 193, which controls the duty ratio of transistor 191. The output DC voltage of voltage-drop converter 19 is supplied to indoor fan inverter 11. Then, indoor fan inverter 11 switches the DC voltage, and supplies it to the stator windings of indoor fan DC motor 8M via normal closed contact type switch 71. The method of controlling indoor fan inverter 11 is the same as that of compressor inverter 10 which has been described with reference to FIG. 5. The only difference between compressor inverter 10 and indoor fan inverter 11 is that the output voltage control of indoor fan inverter 11 is not PWM control of an inverter such as is used in compressor inverter 10. Indoor fan inverter 11 does not control its output voltage. The output voltage is controlled by voltage-drop DC/DC converter 19. Therefore, the output of indoor fan inverter 11 is full-wave conduction.

Indoor fan inverter 11 includes paired transistors Tr11 to Tr16 which make up six arms. AC output voltages are extracted from three AC output terminals U, V, W. A brushless DC motor includes indoor fan inverter 11 and indoor fan DC motor 8M. The position of normally closed contact type switch 71 is controlled by switch drive circuit 90.

Current detection resistor 30, which has a low resistance, is connected in series to the input circuit of indoor fan inverter 11. Indoor fan control circuit 23 includes both over-current detection circuit 75, which detects over-currents in the input circuit of indoor fan inverter 11 based on a voltage drop across current detection resistor 30, and inverter drive circuit 76, which drives transistors Tr11 to Tr16 of indoor fan inverter 11. The detection output signals of over-current detection circuit 75 are transmitted to inverter drive circuit 76, voltage determination circuit 77 and abnormality detail indication circuit 78.

The potentials of each phase output terminal U, V and W of indoor fan inverter 11 are input to comparators 79, 80 and 81, together with the neutral point potential of neutral point N of indoor fan DC motor 8M. In each comparator 79, 80, 81, each phase output terminal potential is compared to the neutral point potential. Here, instead of directly making a connection to neutral point N of indoor fan DC motor 8M, a simulated neutral point potential can be used by star-connecting three equal value resistors to the output terminals of indoor fan inverter 11 or the winding terminals of indoor fan DC motor 8M. The common node of the star-connected resistors can be used as the neutral point potential.

The comparison output signals of comparators 79 to 81 are transmitted to position determination circuit 82 and pattern comparison circuit 83. The rotor position of indoor fan DC motor 8M is detected by position determination circuit 82. The position detection signals of position determination circuit 82 are transmitted to conducting phase determination circuit 84 and rotational speed detection circuit 85. Rotational speed detection circuit 85 detects the rotational speed of indoor fan DC motor 8M based on the input position detection signals, and transmits a rotational speed detection signal to rotational speed comparison circuit 87. 'Operate' instruction (a) generated from main control circuit 25 is input to specific pattern output circuit 86, and indoor fan rotational speed instruction (c) is input to rotational speed comparison circuit 87.

When 'Operate' instruction (a) is input, specific pattern output circuit 86 transmits specific patterns described later to inverter drive circuit 76, pattern comparison circuit 83 and voltage determination circuit 77. In pattern comparison circuit 83, normal response patterns in response to each specific pattern are pre-stored. Specific pattern comparison circuit 83 compares the patterns from comparators 79 to 81 with the normal response pattern at each time the specific pattern is output from specific pattern output circuit 86. When the result of the comparison in pattern comparison circuit 83 is normal, that is both data are the same, pattern comparison circuit 83 transmits an 'Activation Permit' signal to activation control circuit 88. When the result of the comparison is abnormal, that is there is a difference between the data, pattern comparison circuit 83 transmits an abnormality output signal to abnormality detail identification circuit 89, switch drive circuit 90 and inter-phase voltage measurement output circuit 91. The output signal of inter-phase voltage measurement output circuit 91 is transmitted to voltage determination circuit 77 and inverter drive circuit 76.

The comparison result signal obtained by rotational speed comparison circuit 87 is transmitted to activation control circuit 88 and voltage determination circuit 77. The AC inter-phase voltages (between U and V, between V and W, and between W and U) output from indoor fan inverter 11 are detected by voltage detection circuits 92, 93 and 94, and are input to inter-phase voltage unbalance detection circuit 95. Here, if an unbalance of inter-phase voltages is detected, an unbalance detection signal is transmitted to abnormality detail identification circuit 89. If abnormality detail identification circuit 89 identifies an abnormality based on the signals from inter-phase voltage unbalance detection circuit 95 and pattern comparison circuit 83, abnormality detail identification circuit 89 transmits an abnormality detail signal to abnormality detail indication circuit 78.

Motor abnormality discrimination circuit 96 discriminates a motor abnormality based on the output signal of position determination circuit 78 and the output signal of activation control circuit 88. If there is an abnormality, motor abnormality discrimination circuit 96 transmits an abnormality signal to abnormality detail indication circuit 78 and activation control circuit 88. Activation control circuit 88 also receives signals from pattern comparison circuit 83 and rotational speed comparison circuit 87. Activation control circuit 88 transmits its output signal to voltage determination circuit 77, conducting phase determination circuit 84, position determination circuit 82 and motor abnormality discrimination circuit 96. As indicated above, circuit part 97 which is surrounded by a single dotted line (the part in which components 75, 77, 82 to 89 and 91 to 96 are shown) can be achieved by a microprocessor programmed with appropriate software or with logic circuits.

<Specified Pattern Output Before Activation>

The AC voltage from AC power source 13 is converted to DC by rectifier 16. Then, it is adjusted to a constant value DC voltage by DC/DC converter 18. The DC voltage obtained via the secondary winding of switching transformer 181 and half-wave rectification circuit 183, which are included in DC/DC converter 18, is about 35V, and is used for driving fan indoor fan DC motor 8M. Output voltage $V_{dd}$ of power source circuit for control circuit which is connected to the tertiary winding of transformer 181 is about 10V DC, and is used as the control circuit operation power source. The minimum duty ratio of switching transistor 182 is set so that a sufficient output voltage $V_{dd}$ is obtained, even when indoor fan DC motor 8M is not being driven.

When the air conditioner is instructed to commence operation by the user, 'Operate' instruction (a) from main control circuit 25 is input to specific pattern output circuit 86. Specific pattern output circuit 86 causes inverter drive circuit 76 to output 3-phase output patterns which have been preset and, at the same time, causes voltage-drop type DC/DC converter 19 to generate a DC output of about 25V. Thus, voltage drop DC/DC converter 19 outputs a DC voltage of about 25V. At the same time, indoor fan inverter 11 performs the forced supply of specific pattern voltages to the stator windings of indoor fan DC motor 8M. These patterns are achieved by following the transistor output patterns shown in FIG. 10. After the output of a) pattern for a 100 ms (milliseconds) interval, there is a stopped interval of 10 ms and the output of b) pattern is performed thereafter.

<Detection Indoor Fan Inverter 11 Short-Circuit Abnormality>

When over-current detection circuit 75 detects an over-current during generation of pattern a) or b), it is considered to result from a short-circuit abnormality of the transistors in indoor fan inverter 11, and over-current detection circuit 75 outputs over-current abnormality signal to abnormality detail indication circuit 78. By this abnormality signal, abnormality detail indication circuit 78 displays an transistor short-circuit abnormality. At the time when the over-current is detected, over-current detection circuit 75 instructs the prohibition of conduction to inverter drive circuit 76 so that no further damage occurs. Furthermore, at the same time, over-current detection circuit 75 stops the operation of voltage-drop type DC/DC converter 19. By the prohibition instruction, inverter drive circuit 76 will not thereafter drive indoor fan inverter 11 until resetting is performed after completion of repair.

Indoor fan inverter 11 is usually assembled in an integral package because its input and output voltages are at a low level. For such an inverter, repair occurs by replacing all transistors Tr11 to Tr16. Therefore, it is sufficient only to display an transistor short-circuit abnormality by abnormality detail indication circuit 78.

<Detection of Position Detection Circuit, Inverter 11 or Inverter Drive Circuit 78 Abnormality>

When the components of inverter 11 are determined to be normal during the output of specific patterns a) and b), the output of the position detection circuit (comparators 79 to 81 in this circuit) are compared with correct comparator outputs in response to the specific patterns. Therefore, the agreement/disagreement of the normal output pattern of the position detection circuit shown in FIG. 10, which is preset, corresponding to the specific patterns output by specific pattern output circuit 86, and the actual output of the position detection circuit are compared by pattern comparison circuit 83. Here, if both agree, pattern comparison circuit 83 outputs an 'Activation Permit' signal to activation control circuit 88.

If there is a difference between the two during the output of specific patterns a) and b), pattern comparison circuit 83 outputs an abnormality output relating to the position detection circuit (79 to 81) or to indoor fan inverter 11/inverter drive circuit 76. This abnormality output is input to abnormality detail identification circuit 89, inter-phase voltage measurement output circuit 91 and switch drive circuit 90.

In this embodiment, the specific patterns are taken as the two three-phase conduction patterns a) and b). However, as shown in FIG. 11, three conduction patterns in which two phases are connected may be used. When the conduction pattern shown in FIG. 11 is used, an output of the comparators shown as "-" in FIG. 11 is not determined to be 'H' or 'L'. Therefore, the undetermined output is ignored in pattern comparison circuit 83. Conduction patterns for detecting the abnormality must be selected such that individual stator windings exhibit both higher voltages and lower voltages than neutral point 0. That is, conduction patterns may be used in which all the outputs of comparators 79 to 81 take values "H" and "L".

Abnormality detail identification circuit 89 does not immediately indicate the abnormality detail. When abnormality detail identification circuit 89 receives the abnormality output from pattern comparison circuit 83, abnormality detail identification circuit 89 starts to identify whether a position detection circuit abnormality or an inverter/drive circuit abnormality has occurred.

<Abnormality Identification of Position Detection Circuit and Inverter 11/Inverter Drive Circuit 76>

When the abnormality output is input to switch drive circuit 90, switch drive circuit 90 opens normally closed contact switch 71. When inter-phase voltage measurement output circuit 91 receives the abnormality output from pattern comparison circuit 83, inter-phase voltage measurement output circuit 91 causes voltage determination circuit 77 to control voltage-drop type DC/DC converter 19 to produce a constant voltage of about 20V. At the same time, inter-phase voltage measurement output circuit 91 outputs an forced commutation signal to inverter drive circuit 78. The inverter drive circuit 78 drives each transistor Tr11 to Tr16 so that it performs conduction switching (forced commutation) by which indoor fan DC motor 8M would rotate at about 50 rps. During normal operation, conduction determination circuit 84 transmits commutation instructions to inverter drive circuit 76 based on the detection output of position determination circuit 82. However, at this time, it switches conduction in a constant cycle unrelated to position determination circuit 82.

In this case, switch drive circuit 90 has already opened switch 71 by the abnormality output from pattern comparison circuit 83. Thus, current is not applied to indoor fan DC motor 8M. If indoor fan inverter 11/inverter drive circuit 76 are normal while they are outputting the forced commutation pattern, the mean value of each inter-phase output voltage of U-V, V-W and W-U of indoor fan inverter 11 should be constant. On the other hand, when there is an open phase or a break in a connection between inverter drive circuit 76 and each transistor Tr11 to Tr16, the mean values are not constant and there is an unbalance. Therefore, each inter-phase mean voltage is detected by voltage detection circuits 92 to 94. These detected inter-phase mean voltages are input to inter-phase voltage unbalance detection circuit 95. Then, inter-phase voltage unbalance detection circuit 95 judges whether each inter-phase voltage is within a predetermined domain with a specified width. If each inter-phase voltage is within the predetermined domain, inter-phase voltage unbalance detection circuit 95 outputs a 'Normal' identification signal to abnormality detail identification circuit 89. If at least one of the inter-phase voltages is not within the predetermined domain, inter-phase voltage unbalance detection circuit 95 outputs a 'Abnormal' identification signal to abnormality detail identification circuit 89. When abnormality detail identification circuit 89 receives an 'Abnormal' output, abnormality detail identification circuit 89 outputs a signal which indicates indoor fan inverter 11/inverter drive circuit 76 is abnormal to abnormality detail indication circuit 78. Then, abnormality detail indication circuit 78 displays an abnormality of indoor fan inverter 11/inverter drive circuit 76. On the other hand, when inter-phase voltage unbalance detection circuit 91 has output a 'Normal' output, abnormality detail identification circuit 89 outputs a signal which indicates the position detection circuit (comparators 79 to 81) is abnormal to abnormality detail indication circuit 78, and abnormality detail indication circuit 78 displays an abnormality of the position detection circuit (comparators 79 to 81).

Inter-phase voltage measurement output circuit 91 sets sufficient time (for instance, 20 seconds) on a built-in timer from the start of measurement to the finish of inter-phase voltage unbalance detection. When the built-in timer finish its count, inter-phase voltage measurement output circuit 91 outputs a 'Stop' output to inverter drive circuit 76 and voltage determination circuit 77. By inputting the 'Stop' signal, inverter drive circuit 78 stops switching the transistors Tr11 to Tr16, and voltage determination circuit 77 stops switching pulses generated by switching pulse generator 193. Consequently, 20 seconds after forced commutation is started for discriminating abnormalities, the output voltage of voltage-drop type DC/DC converter 19 becomes 0, and the forced commutation switching of transistors Tr11 to Tr16 is ended.

This completion may also be obtained, without using a timer, when inter-phase voltage unbalance detection circuit 95 has completed detection and has output the result. In this case, forced commutation can be ended at the time inter-phase voltage unbalance detection circuit 95 completes detection. Thus, there is the advantage of no wasteful conduction.

<Summary of Abnormality Checking and Identification>

As described above, three different types of abnormalities, a short-circuit abnormality of the transistors of indoor fan inverter 11, a position detection circuit (comparators 79 to 81) abnormality and an indoor fan inverter 11/inverter drive circuit 76 abnormality can be identified and displayed by the above series of operations.

<Normal Operation After Abnormality Checking and Identification>

After the checking operations described above, if there are no abnormalities, pattern comparison circuit 83 outputs an 'Activation Permit' signal to activation control circuit 88. Thereafter, rotational speed detection circuit 85 calculates the rotational speed of indoor fan DC motor 8M from the output of position determination circuit 82. Rotational speed comparison circuit 87 compares the indoor fan rotational speed detected by rotational speed detection circuit 85 and an instructed indoor fan rotational speed which is designated by indoor fan rotational speed instruction (c), input from main control circuit 25. When the detected indoor fan rotational speed is less than the instructed indoor fan rotational speed, rotational speed comparison circuit 87 outputs a 'speed increase' signal to voltage determination circuit 77 and activation control circuit 88. While when the detected indoor fan rotational speed detected is more than the instructed indoor fan rotational speed, rotational speed comparison circuit 87 outputs a 'speed decrease' signal to voltage determination circuit 77 and activation control circuit 88. Before activation, the rotational speed detection output of rotational speed detection circuit 85 is 0 because there is no position detection output. Therefore, rotational speed comparison circuit 87 outputs the 'speed increase' signal.

After activation control circuit 88 has received an 'Activation Permit' signal, activation control circuit 88 starts activation when it has received the 'speed increase' signal from rotational speed comparison circuit 87.

<Normal Activation>

(i) Forced Commutation

Activation control circuit 88 sets a 30-second time on a built-in timer. Also, activation control circuit 88 instructs voltage determination circuit 77 to output an activation voltage. As long as voltage determination circuit 77 has received this instruction, voltage determination circuit 77 ignores the 'speed increase' or 'speed decrease' signals output from speed of rotation comparison circuit 87. Instead, voltage determination circuit 77 controls the duty ratio of transistor 191 of DC/DC converter 19 via pulse generator 193 so that DC/DC converter 19 outputs an activation voltage. The activation voltage is set so that the voltage gradually increases in proportion to time to become about 10V after 30 seconds.

At the same time, activation control circuit 88 supplies an instruction to conducting phase determination circuit 84 to execute forced commutation operation at the time of activation. Then, conducting phase determination circuit 84 supplies a forced commutation switching signal to inverter drive circuit 76. The forced commutation switching signal causes conduction for the period of an electrical angle of 120° by shifting each phase 120°, both during forced commutation operation and during normal commutation by position detection. Thus, one phase always is non-conducting.

Conducting phase determination circuit 84 starts conduction from an arbitrary phase. Then, it switches to the next phase in the specified rotational direction unrelated to position detection. This forced commutation is first started at a low frequency. The frequency is gradually increased and is finally set so that it becomes an output by which indoor fan DC motor 8M rotates at about 10 rps.

(ii) Start of Position Detection

This forced commutation operation is completed after 30 seconds. However, 2 to 3 seconds before this 30 seconds has elapsed, activation control circuit 88 outputs an operation start signal to position determination circuit 82.

By receiving this signal, position determination circuit 82 starts processing the output of the position detection circuit (comparator 79 to 81). The position detection circuit is a circuit for detecting the rotational position of the rotor by comparing the voltages of each stator winding with the neutral point potential of the motor stator winding. When the stator winding which is the subject of detection is a non-conducting phase, it acts as a generator as a result of the rotation of the permanent magnets mounted in the rotor and generates a voltage (induced voltage) in the winding. The induced voltage is compared with the neutral point potential of the stator windings. Therefore, the times at which each of the stator windings passes the front of the permanent magnets are detected.

Position determination circuit 82 monitors the output of the specific comparator which corresponds to the non-conducting phase when selected by conducting phase determination circuit 84. Position determination circuit 82 detects the timing at which the output of that comparator changes from "H" to "L" or from "L" to "H". Then, it identifies whether the output of the comparator successively switches normally within a specified time period from the time at which it stops conducting. If the discrimination result is normal, commutation by position detection based on the detection output of the position detection circuit (comparators 79 to 81) is started from the completion of forced commutation operation.

(iii) Commutation by Position Detection

For commutation by position detection, position determination circuit 82 calculates half of the time period (equivalent to an electrical angle of 30°) from the previous position detection by position determination circuit 82 to the current position detection (equivalent to an electrical angle of 60°) and stores the half time period. Furthermore, position determination circuit 82 begins counting the time after the current position detection. After that, when the half time period has elapsed after the current position detection, position determination circuit 82 outputs a conduction switching signal to conducting phase determination circuit 84. By this conduction switching signal, conducting phase determination circuit 84 switches conduction to the next conducting phase.

At the same time, position determination circuit 82 outputs a signal to rotational speed detection circuit 85 every time a position detection is performed. Rotational speed detection circuit 85 detects the time from the previous position detection to the current position detection, and calculates the rotational speed of indoor fan DC motor 8M based on this time. That is, the time from one position detection to the next position detection is equivalent to an electrical angle of 60° and, in a 4-pole motor, 1 rotation is an electrical angle of 360°×2=720°. Therefore, 12 repetitions of this time of 60° (720 ÷60=12) is the time T of 1 revolution of the motor. Also, the reciprocal of the time T of 1 revolution of the motor (=1/T) is the rotational speed Ni (rps) of indoor fan DC motor 8M.

(iv) Rotational Speed Control (Voltage Control(PAM))

Motor rotational speed Ni detected by rotational speed detection circuit 85 is compared with the instructed indoor fan rotational speed Nsi which is designated by indoor fan rotational speed instruction (c) input from main control circuit 25 by rotational speed comparison circuit 87. When Ni>Nsi, rotational speed comparison circuit 87 outputs an 'Decrease Voltage' instruction to voltage determination circuit 77; when Ni<Nsi, rotational speed comparison circuit 87 outputs a 'Increase Voltage' instruction to voltage determination circuit 77, and when Ni=Nsi, rotational speed comparison circuit 87 outputs a 'Maintain Same Voltage' instruction. In this way, when actual indoor fan rotational speed Ni is lower than instructed indoor fan rotational speed Nsi, the output voltage of voltage-drop type DC/DC converter 19 is increased. Conversely, when actual indoor fan rotational speed Ni is more than instructed indoor fan rotational speed Nsi, voltage determination circuit 77 controls the duty ratio of switching transistor 191 of voltage-drop type DC/DC converter 19 so that the output voltage is reduced.

In short, if position detection is performed normally within 30 seconds after activation by forced commutation, commutation by position detection will be commenced after 30 seconds have elapsed. From this time, the voltage applied to the motor will be controlled based on the relationship between instructed indoor fan rotational speed Nsi and actual indoor fan rotational speed Ni. At the time of activation, instructed indoor fan rotational speed Nsi is higher than actual indoor fan rotational speed Ni. Therefore, the voltage applied to indoor fan DC motor 8M, or the output voltage of voltage-drop type DC/DC converter 19, is changed so that it becomes greater. When this voltage becomes higher, the motor torque increases, and the rotational speed of the motor begins to rise. When the rotational speed of the motor rises, the position detection interval shortens and commutation based on position detection also speeds-up in response to this. As a result, when actual indoor fan rotational speed Ni ultimately agrees with instructed indoor fan rotational speed Nsi, the output voltage of voltage-drop type DC/DC converter 19 has increased, and thereafter stable operation will be performed.

When instructed indoor fan rotational speed Nsi is reduced or when actual indoor fan rotational speed Ni increases above instructed indoor fan rotational speed Nsi due to a decrease of the load of indoor fan DC motor 8M, rotational speed comparison circuit 87 transmits a 'Decrease Voltage' instruction to voltage determination circuit 77. Thus, the output voltage of voltage-drop type DC/DC converter 19 reduces. Consequently, the position detection interval increases, and position detection commutation also lengthens in response to the position detection interval. It stabilizes at the point where actual indoor fan rotational speed Ni agrees with instructed indoor fan rotational speed Nsi.

<Activation Malfunction Abnormality>

The above description relates to normal activation operation. However, if the rotor of indoor fan DC motor 8M is constrained, indoor fan DC motor 8M cannot rotate. Therefore, an output of the position detection circuit (comparators 79 to 81) cannot be obtained during the forced commutation operation. Thus, even if the forced commutation operation is repeated, the outputs of comparators 79 to 81 will not change, and position determination circuit 82 cannot perform normal position detection. As a result, position determination circuit 82 outputs a signal indicating that position detection cannot be performed to motor abnormality discrimination circuit 96.

After a period of 30 seconds has elapsed from the activation of compressor DC motor 8M, activation control circuit 88 outputs a 30 seconds elapsed signal to motor abnormality discrimination circuit 96. When both of these signals are input, motor abnormality discrimination circuit 96 transmits a motor abnormality signal, indicating that indoor fan DC motor 8M cannot be rotated due to a constriction, or the like, to abnormality detail indication circuit 78. As a result, abnormality detail indication circuit 78 indicates an indoor fan DC motor 8M abnormality.

When an abnormality is discriminated, motor abnormality discrimination circuit 96 transmits an 'Activation Not Permitted' signal to activation control circuit 88. Then, voltage determination circuit 77 is stopped through activation control circuit 88. Conducting phase determination circuit 84 is also stopped, and further operation is prohibited.

In the case of a fan motor, there is no possibility that activation malfunction occurs due to excess load, because the load is light. Therefore, an abnormality of indoor fan DC motor 8M is determined after one activation operation.

(4) Outdoor Fan Control

<Composition of Main Circuit and Control Circuit>

FIG. 12 shows the details of the main system of outdoor fan 7 and outdoor fan control circuit 24. In this embodiment, a propeller fan is used as outdoor fan 7. Outdoor fan DC motor 7M is a synchronous motor having four permanent magnets in the rotor. Three-phase windings are provided on the stator. These are delta-connected.

A DC voltage is obtained via rectification circuit 20 and capacitor 21 which are supplied with an AC voltage of 100V from AC power source 13. Outdoor fan DC motor 7M is driven by converting the DC voltage to an AC voltage via outdoor fan inverter 12. Outdoor fan inverter 12 includes six transistors Tr21 to Tr26 which make up six arms. Three-phase AC output voltages are extracted from AC output terminals U, V and W. A brushless DC motor is formed by outdoor fan inverter 12 and outdoor fan DC motor 7M. Connector 100, which functions as a circuit breaker, is provided between outdoor fan inverter 12 and outdoor fan DC motor 7M. In the same way as shown in FIG. 1, voltage divider resistors 31 detect the neutral point potential of the input voltage of outdoor fan inverter 12 and low resistance current detection resistor 32 detects its input current.

Outdoor fan inverter 12 is also controlled by the control modes in FIGS. 6(a) to 6(c). Over-current detection circuit 101 detects over-current in the input circuit of outdoor fan inverter 12, based on the output voltage of current detection resistor 32. Inverter drive circuit 102 drives transistors Tr21 to Tr26 of outdoor fan inverter 12. The over-current detection signal of over-current detection circuit 101 is transmitted to inverter drive circuit 102 and abnormality detail indication circuit 103. Each of the output terminal voltages at the output terminals U, V, W of outdoor fan inverter 12 is compared by comparators 104, 105 and 106 to the neutral point potential obtained via voltage divider resistors 31. Each comparison result signal is input to position determination circuit 107 and pattern comparison circuit 108.

The position detection signal obtained by position determination circuit 107 is transmitted to conducting phase determination circuit 109, rotational speed detection circuit 110 and motor abnormality discrimination circuit 111. Rotational speed detection circuit 110 calculates the outdoor fan rotational speed No based on the time interval between the previous input of a position detection signal and the current input of a position detection signal. The output terminal of motor abnormality discrimination circuit 111 is connected to abnormality detail indication circuit 103. 'Operate' instruction (a) transmitted from main control circuit 25 is input to activation control circuit 112, and outdoor fan rotational speed instruction (d) which designates an outdoor fan rotational speed No is input to rotational speed comparison circuit 113.

Rotational speed comparison circuit 113 compares the detected outdoor fan rotational speed No input from rotational speed detection circuit 110 with a instructed outdoor fan rotational speed Nd which is designated by outdoor fan rotational speed instruction (d) and transmits a comparison result signal to activation control circuit 112 and voltage determination circuit 114. The output terminal of activation control circuit 112 is connected to motor abnormality discrimination circuit 111 and voltage determination circuit 114. The output terminal of voltage determination circuit 114 is connected to conducting phase determination circuit 109. The output signals of conducting phase determination circuit 109 are also input to pattern comparison circuit 108. The output terminal of pattern comparison circuit 108 is connected to abnormality detail indication circuit 103. When forced operation switch 115, which is a manually operable switch, is pushed, forced operation circuit 116 outputs a forced operation instruction to inverter drive circuit 102.

The control circuits which control the compressor or the indoor fan described above perform specific pattern outputs to the motor windings from the inverter before activation. However, in outdoor fan 7, various abnormalities are discriminated using the output patterns themselves during normal activation operation.

When a user enters a command for the air conditioner to commence operation, an 'Operate' instruction (a) from main control circuit 25 is input to activation control circuit 112. At the same time, rotational speed comparison circuit 113 compares the detected outdoor fan rotational speed No with instructed outdoor fan rotational speed Nd (which indicates one of 'High', 'Medium', 'Low'). PWM duty ratio setting signals from voltage determination circuit 114 are input to conducting phase determination circuit 109. Conducting phase determination circuit 109 outputs ON/OFF signals for transistors Tr21–Tr26 in accordance with the PWM conduction phase patterns m1) to m6) shown in FIG. 13. During activation, the conducting phases are switched in accordance with the output patterns depending on time and unrelated to position detection.

This output pattern is the same as conducting phase switching based on a position detection which is described later. The only difference is that the switching timing of the conducting phases is based on the position detection.

During activation, this conducting phase switching starts at a low frequency of about 1.6 rps. The frequency is gradually increased, and is set so that it ultimately will drive outdoor fan DC motor 7M at about 10 rps.

FIG. 13 illustrates PWM conduction based on the PWM duty ratio settings determined by voltage determination circuit 114 under normal conditions. In the position detection circuit output columns, "-" indicates the position detection phase and when a " Detection Not Possible" signal is generated due to insufficient induced voltage. "( )" indicates the output variation state of comparators 104 to 106 in the normal state obtained when sufficient induced voltage is generated after a specified time from activation. Also, "L/H" or "H/L" indicates comparator output in the phase which is in PWM conduction. "L/H" shows it is L when the transistor is ON and H when OFF. Conversely, "H/L" shows it is H when the transistor is ON and L when OFF. The voltage of each phase is shown in FIGS. 6(a)–6(c).

Pattern m1) is first output at the time of activation and this is switched to pattern m2) after about 50 ms. After that, every 50 ms, the pattern is switched sequentially to pattern m3) to m6), and after pattern m6) returns to pattern m1) once more. Here, since outdoor fan DC motor 7M has a four poles rotor, thus, outdoor fan DC motor 7M is rotated once by repeating the outputs of patterns m1) to m6) twice. The speed of rotation at this time is about 1 to 6 rps. Then, this switching time gradually shortens, so that ultimately it switches sequentially at about 8 ms, and produces an output which rotates outdoor fan DC motor 7M at about 10 rps.

Outdoor fan control circuit 24 can be achieved by a microprocessor programmed with appropriate software or with logic circuits.

The following is a description of the identification of short circuit abnormalities of transistors Tr21 to Tr26 which compose outdoor fan inverter 12, and abnormalities of the position detection circuit (comparators 104 to 106) or outdoor fan inverter 12/inverter drive circuit 102 abnormalities.

<Detection of Outdoor Fan Inverter 12 Short-Circuit Abnormality>

When over-current detection circuit 101 has detected an over-current, it is judged as a short-circuit abnormality of outdoor fan inverter 12. Therefore, an abnormality indication of a transistor short-circuit is generated by abnormality detail indication circuit 103 when an over-current signal is received from over-current detection circuit 101. At the same time, when over-current detection circuit 101 detects the over-current, over-current detection circuit 101 disables inverter drive circuit 102 so that further damage will not occur. As a result, inverter drive circuit 102 will not thereafter drive outdoor fan inverter 12 until it is reset after completion of repair.

The output state of each comparator 104 to 106 is checked during the output of patterns m1) to m6). That is, whether the output of comparator 106 is L in pattern m1) is checked by pattern comparison circuit 108. Then, it checks whether the output of comparator 105 is H in pattern m2). Thereafter, whether the output of comparator 104 is L in pattern m3); whether the output of comparator 106 is H in pattern m4); whether the output of comparator 105 is L in pattern m5) and whether the output of comparator 104 is H in pattern m6) are sequentially checked. The abnormality or normality of the individual H and L outputs for all comparators 104 to 106 is checked in this way.

However, if synchronization with the PWM output can be accurately obtained, two comparator outputs may be simultaneously checked in one pattern. That is say, it is possible to check by pattern comparison circuit 108 that, for example, in pattern m1), comparator 104 is H when PWM output is ON, and comparator 104 is L when PWM output is OFF.

In this case, it is possible to check comparator 104 in pattern m1), comparator 106 in pattern m2) and comparator 105 in pattern m3). However, in this case, accurate synchronization with the PWM output is required as above described. At the same time, since the applied voltage is low at the time of activation, the PWM ON period is short. Thus a risk of erroneous detection exists due to noise, etc. For this reason, when performing a comparator check in a PWM conducting phase, it is necessary to take countermeasures such as only judging there to be an abnormality when the conduction results of a number of tests are all abnormal.

When, as the result of the above check, all comparators are judged as normal by pattern comparison circuit 108, activation operation is continued by repeating the output pattern m1) to m6).

On the other hand, if the comparator outputs differ from the predetermined values which is shown in FIG. 13 during the outputting of patterns m1) to m6), pattern comparison circuit 108 determines that there is an abnormality in the position detection circuit or that there is an abnormality in outdoor fan inverter 12 or inverter drive circuit 102 and outputs an abnormality signal to abnormality detail indication circuit 103. Then, abnormality detail indication circuit 103 displays a position detection circuit abnormality or outdoor fan inverter 12/inverter drive circuit 102 abnormality.

<Abnormality Identification in Position Detection Circuit and Outdoor Fan Inverter 12/Inverter Drive Circuit 102>

A service engineer can recognize that there is the position detection circuit abnormality or outdoor fan inverter 12/inverter drive circuit 102 abnormality from the display. Then, the service engineer removes connector 100 in the wiring between outdoor fan DC motor 7M and outdoor fan inverter 12, and presses forced operation switch 115. When forced operation switch 115 is pushed, forced operation circuit 116 transmits a forced operation instruction to inverter drive circuit 102. Therefore, inverter drive circuit 102 starts to switch conduction (forced commutation) so that outdoor fan DC motor 7M rotates at about 30 rps, and so that it generates a specified output voltage. Here, the service engineer checks the mean inter-phase voltages U-V, V-W and W-U of outdoor fan inverter 12, using a tester. If these inter-phase voltage are about the same, this proves that outdoor fan inverter 12 and inverter drive circuit 102 are normal. Therefore, the breakdown can be identified as being in the position detection circuit (comparators 104 to 106).

On the other hand, when randomness of more than a permissible value is generated in the inter-phase voltages, this identifies an abnormality in outdoor fan inverter 12/inverter drive circuit 102, e.g., there is open-phase operation due to one of the transistors in outdoor fan inverter 12 being abnormal or inverter drive circuit 102 being abnormal.

Furthermore, an abnormality in any of transistors Tr21 to Tr26 or an abnormality in inverter drive circuit 102 can be distinguished by measuring the drive voltage supplied to each transistor base terminal from inverter drive circuit 102. If a drive voltage of about 5V is applied to each transistor when the transistor should be turned on, inverter drive circuit 102 is normal and at least one of transistors Tr21 to Tr26 has an open-circuit abnormality.

On the other hand, if sufficient drive voltages are not applied to transistors Tr21 to Tr26, there is an abnormality in inverter drive circuit 102. Furthermore, when, as a result of the measurement, there is no unbalance in the output inter-phase voltage of outdoor fan inverter 12, the abnormality is in the position detection circuit (comparators 104 to 106).

Based on the above test results, the service engineer can swiftly complete repairs by replacing the defective circuit components. Forced operation circuit 116 stops to output the forced operation signal after a predetermined time, for instance 1 minute, has elapsed. This time period is determined to be sufficient for the service engineer to perform inter-phase voltage measurements and measurement of the drive voltages from inverter drive circuit 102 which are supplied to transistors Tr21 to Tr26 of outdoor fan inverter 12. Also, to stop mid-way through this period, forced operation switch 115 can be pressed again.

<Summary of Abnormality Checking and Discrimination>

In the above way, the short-circuiting of transistors Tr21 to Tr26, the failure of the position detection circuit (comparators 104 to 106), the open-circuiting of transistors Tr21 to Tr26 of outdoor fan inverter 12 and the failure of inverter drive circuit 102 can be determined.

<Activation Control>

(i) Forced Commutation

If the position detection circuit output is determined to be normal at the start of activation, the output of patterns m1) to m6) from conducting phase determination circuit 109 continues to be repeated. At the same time, the pattern interval is shortened according to the elapsed time, and the PWM conduction duty ratio of voltage determination circuit 114 is made greater.

As a result, outdoor fan DC motor 7M begins to rotate. Then, ultimately, conducting phase determination circuit 109 and voltage determination circuit 114 vary their outputs until the values of the conduction interval and the applied voltage become those which will rotate outdoor fan DC motor 7M at about 10 rps.

(ii) Start of Position Detection

This forced commutation operation continues from the start for about 30 seconds. However, 2 to 3 seconds before its completion, a 'Operate' output is provided to position determination circuit 107 from activation control circuit 112. On receiving this signal, position determination circuit 107 starts the operation of detection and discrimination of the outputs of the position detection circuit (comparators 104 to 106). The position detection circuit compares the neutral potential of the input DC power source of outdoor fan inverter 12, which is extracted via voltage divider resistors 31, with each phase AC output voltage. The comparison outputs are supplied to position determination circuit 107. Position determination circuit 107 monitors the output of the specific comparator which corresponds to the non-conducting phase selected by conducting phase determination circuit 109 at that time. It also detects the timing at which the output of that comparator changes from "H" to "L" or from "L" to "H".

As has already been described above, one phase is in PWM conduction at all times. Therefore, a great deal of noise is contained in the induced voltage input to each comparator 104 to 106. For this reason, position determination circuit 107 is synchronized with the PWM conduction output from conducting phase determination circuit 109 so that the comparator output is effective only at certain times during the period when PWM conduction is ON. Also, position determination circuit 107 identifies whether the output of the comparator switches normally within the specified time limit, based on forced commutation from conducting phase switching.

If this identification indicates a failure, it is processed as a motor abnormality due to an activation malfunction. The process in this case is described later.

If the above identification result is 'Normal', commutation by position detection based on the detection output of the position detection circuit starts at the time forced commutation operation is completed, that is, 30 seconds after activation control circuit 112 has started activation operation.

(iii) Commutation by Position Detection>

For commutation by position detection, half of the time (equivalent to an electrical angle of 30°) from the previous position detection by position determination circuit 107 to the current position detection (equivalent to an electrical angle of 60°) is stored. Then, when that time has elapsed after the current position detection, position determination circuit 107 outputs a conduction switching signal to conducting phase determination circuit 109. Conducting phase determination circuit 109 switches the conduction pattern to the next pattern based on this conduction switching signal. That is, when conduction has been performed by pattern m1), it switches to the next conduction pattern m2).

At the same time, position determination circuit 107 outputs the position detection signal to rotational speed detection circuit 110 every time a position detection is performed. Rotational speed detection circuit 110 detects the time from this position detection to the next position detection which is equivalent to an electrical angle of 60°, and calculates the rotational speed of outdoor fan DC motor 7M based on this measured time.

That is, the time from one position detection to the next position detection is equivalent to an electrical angle of 60° and, in a 4-pole motor, 1 rotation is an electrical angle of 360°×2=720°. Therefore 12 (=720÷60) periods of 60° is the time T of 1 revolution of the motor. Also, the reciprocal of the time T of 1 revolution of the motor (=1/T) becomes rotational speed r (rps) of the motor.

<Rotational Speed Control (Voltage Control(PWM))>

The speed control of outdoor fan DC motor 7M is the same as that of compressor DC motor 2M. That is, outdoor fan DC motor 7M is PWM controlled. Outdoor fan motor rotational speed No detected by rotational speed detection circuit 110 is compared by rotational speed comparison circuit 113 with instructed outdoor fan rotational speed Nd which is preset internally corresponding to rotational speed instruction (d) ('High'/'Medium'/'Low') input from main control circuit 25. When Nd>No, rotational speed comparison circuit 113 outputs an 'Increase Voltage' instruction to voltage determination circuit 114; when Nd<No, it outputs a 'Decrease Voltage' instruction, and when Nd=No, it outputs a 'Maintain Same Voltage' instruction. Therefore, when Nd>No, voltage determination circuit 114 increases the PWM duty ratio of the PWM conduction phase so that the output voltage of outdoor fan inverter 12 becomes higher. Conversely, when Nd<No, the duty ratio is made smaller in order to reduce the output voltage.

In short, if position detection is performed normally within 30 seconds of the start of activation by forced commutation, commutation by position detection will be commenced thereafter. From this time, the voltage applied to the motor will be controlled based on the relationship between instructed outdoor fan rotational speed Nd and actual outdoor fan rotational speed No. At this time, instructed outdoor fan rotational speed Nd is higher than actual outdoor fan rotational speed No. Therefore, the voltage applied to outdoor fan DC motor 7M, that is, the PWM duty ratio of the PWM conducting phase, is increased so that the output voltage becomes greater. When this voltage becomes higher, the motor torque also increases, and the rotational speed of outdoor fan DC motor 7M begins to increase. When outdoor fan rotational speed No increases, the position detection interval shortens and commutation based on position detection also speeds-up in response. As a result, when outdoor fan rotational speed No ultimately coincides with instructed outdoor fan rotational speed Nd, the PWM duty ratio has increased. The PWM duty ratio stabilizes when outdoor fan rotational speed No approximately agrees with instructed outdoor fan rotational speed Nd.

When instructed outdoor fan rotational speed Nd is reduced or when actual outdoor fan rotational speed No increases above instructed outdoor fan rotational speed Nd due to a decrease in the load, a 'Decrease Voltage' instruction is transmitted from rotational speed comparison circuit 113 to voltage determination circuit 114. Thus, the PWM duty ratio decreases, and the voltage applied to the motor is reduced. The motor rotational speed decreases following a decrease in motor torque. Thus, the position detection interval increases, and position detection commutation also increases in response. Therefore, when actual outdoor fan rotational speed No agrees with instructed outdoor fan rotational speed Nd, the PWM duty ratio stabilizes.

Furthermore, when rotational speed instruction (d) changes, the new outdoor fan rotational speed Nd and actual outdoor fan rotational speed No are compared by rotational speed comparison circuit 113 in the same way. Therefore, when the instructed outdoor fan rotational speed Nd is increased, the PWM duty ratio will be increased. Conversely, when the instructed outdoor fan rotational speed Nd is decreased, the PWM duty ratio will decrease. Consequently, in this case also, after a small time delay, actual outdoor fan rotational speed No will agree with new outdoor fan rotational speed Nd. Thus, operation which matches the rotational speed instructions is performed.

<Activation Malfunction Abnormality>

The above is a description of normal activation. However, when outdoor fan DC motor 7M cannot rotate due to a constraint or the like, the position detection circuit does not produce an output during the forced commutation operation at the time of activation. That is, even if the forced commutation operation is repeated, the required outputs cannot be obtained from comparators 104 to 106 during the specified period of conduction. Therefore, it is considered that normal position detection cannot be performed by position determination circuit 107. As a result, a signal is input to motor abnormality discrimination circuit 111 from position determination circuit 107.

After a period of 30 seconds has elapsed from the activation of outdoor fan DC motor 7M, activation control circuit 112 outputs a 30 seconds elapsed signal to motor abnormality circuit 64. In this case, at the start of activation, it has already been determined that outdoor fan inverter 12, the position detection circuit (comparators 104 to 106) and inverter drive circuit 102 were all operating normally. Therefore, in this case, the possible abnormality is a failure of outdoor fan DC motor 7M in that it does not rotate due to a constriction or the like.

Therefore, a motor abnormality signal is input to abnormality detail indication circuit 103 from motor abnormality discrimination circuit 111. In response, abnormality detail indication circuit 103 indicates that the motor is abnormal. Also, when motor abnormality discrimination circuit 111 identifies an abnormality, it transmits an 'Activation Not Permitted' signal to activation control circuit 112. It also stops conducting phase determination circuit 109, and prohibits operation thereafter.

In the above embodiments, compressor DC motor control, indoor fan DC motor control and outdoor fan DC motor control are described, respectively. However, any of these brushless DC motors can be applied to other DC motor control applications. Therefore, any of motor control circuits 22, 23 and 24 and any of the power circuits can be applied to each of compressor DC motor, indoor fan DC motor and outdoor fan DC motor, or any other application.

Various changes in and modifications of the above-described embodiment can be made without departing from the scope of general inventive concept as defined by the appended claims and their equivalents.

What is claimed is:

1. A control apparatus for a brushless DC motor which has a permanent magnet rotor and a 3-phase stator winding for applying a rotating magnetic field to the permanent magnet rotor, comprising:

a plurality of first comparison circuits, one provided for each phase, for comparing a specified reference voltage with the stator winding terminal voltages;

a circuit detecting rotor position in response to the first comparison circuits, based on induced voltages generated in the stator windings which are non-conducting when the motor is rotated, the circuit switching conduction to each stator winding in response to detection of the rotor position;

a conduction circuit for supplying a specific conduction pattern to each stator winding when the rotor is stopped;

a second comparison circuit for comparing a reference output determined for the conduction pattern with the outputs of the first comparison circuits when the conduction circuit is conducting; and an abnormality detection circuit detecting abnormalities based on the comparison results of the second comparison circuit.

2. A control apparatus for a brushless DC motor which has a permanent magnet rotor and a 3-phase stator winding for applying a rotating magnetic field to the permanent magnet rotor, comprising:

a plurality of first comparison circuits, one provided for each phase, for comparing a specified reference voltage with the stator winding terminal voltages;

a circuit detecting rotor position in response to the first comparison circuits, based on induced voltages generated in the stator windings which are non-conducting when the motor is rotated, the circuit switching conduction to each stator winding in response to detection of the rotor position;

a conduction circuit for selectively supplying a first conduction pattern in which all the stator windings take higher voltages than the specified reference voltage and a second conduction pattern in which all the windings take a lower voltage than the specified reference voltage while the rotor is stopped;

a second comparison circuit for comparing a reference output determined for each conduction pattern and the output of the first comparison circuits when the conduction circuit is supplying the first and second conduction patterns; and an abnormality detection circuit for detecting abnormalities based on the comparison results of the second comparison circuit.

3. A control apparatus for a brushless DC motor which has a permanent magnet rotor and a 3-phase stator winding for applying a rotating magnetic field to the permanent magnet rotor, comprising:

a plurality of first comparison circuits, one provided for each phase, for comparing a specified reference voltage with the stator winding terminal voltages;

a second comparison circuit comparing comparison outputs of the first comparison circuits with a reference signal;

a circuit for detecting rotor position in response to the second comparison circuit, based on induced voltages generated in the stator windings which are non-conducting when the motor is rotated, the circuit switching conduction to each stator winding in response to detection of the rotor position;

a conduction circuit for supplying multiple conduction patterns in which windings of one phase or two phases are at lower voltages than a specified reference voltage and a remaining stator winding is at a higher voltage than the specified reference voltage while the motor is stopped;

a third comparison circuit for comparing a reference output determined for the conduction patterns with the output of the second comparison circuit when the conduction circuit is conducting; and an abnormality detection circuit for detecting abnormalities based on the comparison results of the third comparison circuit.

4. A control apparatus for a brushless DC motor which has a permanent magnet rotor and a 3-phase stator winding for applying a rotating magnetic field to the permanent magnet rotor, comprising:

a plurality of first comparison circuits, one provided for each phase, which compare a specified reference voltage with the stator winding terminal voltages;

a circuit which detects rotor position in response to the first comparison circuits, based on induced voltages generated in the stator windings which are non-conducting when the motor is rotated, the circuit switching conduction to each stator winding in response to detection of the rotor position;

a conduction circuit which supplies multiple conduction patterns in which windings of one phase or two phases are at lower voltages than a specified reference voltage and a remaining phase stator winding is a higher voltage than the reference voltage while the brushless motor is stopped;

a second comparison circuit which compares a reference output determined for the conduction pattern and the outputs of the first comparison circuits during conduction by the conduction circuit; and an abnormality detection circuit which detects abnormalities in response to the comparison results of the second comparison circuit.

5. A control apparatus according to one of claims 1 to 3, wherein the conduction circuit conducts current to each winding prior to activation of the brushless DC motor before a starting of motor operation.

6. A control apparatus according to claim 1, 2 or 3, further including an indication circuit for indicating the abnormality, when the abnormality detection circuit has detected an abnormality.

7. A control apparatus according to claim 1, 2 or 3, further including:

a current detection circuit which detects the current flowing in the motor; and a conduction prohibition circuit which prohibits conduction of current to the stator windings after the current detection circuit has detected an over-current during conduction to the windings by the conduction circuit.

8. A control apparatus according to claim 7, further including an indication circuit which indicates an over-current abnormality when the current detection circuit has detected an over-current during conduction to the windings by the conduction circuit.

9. A control apparatus according to one of claim 1, 2 or 3, wherein the reference voltage is a voltage approximately intermediate between the DC voltage inputs to the brushless DC motor.

10. A control apparatus according to claim 1, 2, 3 or 4, further including a fan which is rotated by the brushless DC motor.

11. A control apparatus according to claim 1, 3 or 4 wherein the specified reference voltage is a neutral point potential of the 3-phase stator winding.

12. An air conditioner having a sealed compressor and a compressor motor, which is built into the sealed compressor, having a permanent magnet rotor and a 3-phase stator winding for applying a rotating magnetic field to the permanent magnet rotor, comprising:

a plurality of first comparison circuits, one provided for each phase, for comparing a specified reference voltage with the stator winding terminal voltages;

a circuit for detecting rotor position in response to the first comparison circuits based on induced voltages generated in the stator windings which are non-conducting when the motor is rotated, the circuit switching conduction to each stator winding in response to detection of the rotor position;

a conduction circuit for supplying a specific conduction pattern to each stator winding when the rotor is stopped;

a second comparison circuit which compares a reference output determined for the conduction pattern with the outputs of the first comparison circuits when the conduction circuit is conducting; and an abnormality detection circuit which detects abnormalities based on the comparison results of the second comparison circuit.

13. An air conditioner having a sealed compressor and a compressor motor, which is built into the sealed compressor, having a permanent magnet rotor and a 3-phase stator winding for applying a rotating magnetic field to the permanent magnet rotor, comprising:

a plurality of first comparison circuits, one provided for each phase, for comparing a specified reference voltage with the stator winding terminal voltages;

a second comparison circuit comparing comparison outputs of the first comparison circuits with reference signal;

a circuit for detecting rotor position in response to the second comparison circuit, based on induced voltages generated in the stator windings which are nonconducting when the motor is rotated, the circuit switching conduction to each stator winding in response to detection of the rotor position;

a conduction circuit for supplying multiple conduction patterns in which windings of one phase or two phases are at lower voltages than a specified reference voltage and a remaining stator winding is at a higher voltage than the specified reference voltage while the motor is stopped;

a third comparison circuit for comparing a reference output determined for the conduction patterns with the output of the second comparison circuit when the conduction circuit is conducting; and an abnormality detection circuit for detecting abnormalities based on the comparison results of the third comparison circuit.

14. A method for controlling a brushless DC motor which has a permanent magnet rotor, a 3-phase stator winding for applying a rotating magnetic field to the permanent magnet rotor, comparison circuits, one for each phase, which compare a specified reference voltage with the stator winding terminal voltages, a circuit which detects rotor position based on the outputs of the comparison circuits and an inverter circuit which switches conduction to each stator winding in accordance with the detected rotor position, comprising the steps of:

detecting abnormalities based on the outputs of the comparison circuits;

outputting a specified frequency and voltage from the inverter in a state in which connection between the stator windings and the inverter is broken when an abnormality is detected in the detecting step;

measuring output inter-phase voltages of the inverter when the connection is broken; and determining an abnormality of the comparison circuits when the inter-phase voltages obtained by the measuring step are approximately the same value, and determining an abnormality of the inverter otherwise.

* * * * *